United States Patent [19]
Kawamura et al.

[11] Patent Number: 5,981,399
[45] Date of Patent: Nov. 9, 1999

[54] METHOD AND APPARATUS FOR FABRICATING SEMICONDUCTOR DEVICES

[75] Inventors: Yoshio Kawamura, Kokubunji; Tatuharu Yamamoto, Higashi-murayam; Shigeo Moriyama, Tama; Yoshifumi Kawamoto, Kanagawa-ken; Natsuki Yokoyama, Mitaka; Fumihiko Uchida, Hachioji; Minoru Hidaka, Kodaira; Miyako Matsui, Kokubunji, all of Japan

[73] Assignee: Hitachi, Ltd., Tokyo, Japan

[21] Appl. No.: 08/894,308

[22] PCT Filed: Feb. 15, 1995

[86] PCT No.: PCT/JP95/00210

§ 371 Date: Aug. 14, 1997

§ 102(e) Date: Aug. 14, 1997

[87] PCT Pub. No.: WO96/25760

PCT Pub. Date: Aug. 22, 1996

[51] Int. Cl.$^6$ .................................................. H01L 21/00
[52] U.S. Cl. ........................... 438/715; 156/345; 438/716
[58] Field of Search .................. 156/345 PC, 345 MC, 156/345 PH; 438/714, 715, 716; 216/67

[56] References Cited

U.S. PATENT DOCUMENTS 5,013,385  5/1991  Maher et al. .................... 438/716 X
5,076,205  12/1991  Vowles et al. .................... 156/345 X
5,302,209  4/1994  Maeda et al. .................... 156/345 X

FOREIGN PATENT DOCUMENTS 60-184678  9/1985  Japan .
62-147726  7/1987  Japan .
63-28047   2/1988  Japan .
63-252439  10/1988  Japan .
3-19252    1/1991  Japan .
4-63414    2/1992  Japan .
4-206547   7/1992  Japan .

OTHER PUBLICATIONS

"Semiconductor World", pp. 237–242.
"Semiconductor World", pp. 23–31.

*Primary Examiner*—William Powell
*Attorney, Agent, or Firm*—Beall Law Offices

[57] ABSTRACT

A semiconductor device fabrication apparatus having multiple processing chambers for different processes, where a substrate is carried in and out in a sophisticated manner, with their different internal ambient conditions being retained, so that the substrate is free from contamination, thereby manufacturing high-quality semiconductor devices at high throughput. The apparatus includes a movable buffer chamber having a wafer carriage means within a transfer chamber which faces a process chamber, an evacuation means which evacuates of gas the buffer chamber, transfer chamber and process chamber independently, a gas feed means, and a control means.

53 Claims, 24 Drawing Sheets

METHOD AND APPARATUS FOR FABRICATING SEMICONDUCTOR DEVICES

BACKGROUND OF THE INVENTION

1. Field of the Invention

The present invention relates to a method and apparatus for fabricating semiconductor devices, and particularly to a method and device for carrying a substrate into and out of multiple process chambers for different processings in the semiconductor device fabrication apparatus, and to a semiconductor device.

2. Description of the Prior Art

For the fabrication of semiconductor devices, there is known a sequential multi-processing system, as described in Japanese patent publication JP-A-Hei-4-63414, in which multiple process chambers for cleaning, deposition, etching, exposure of latent image, etc. are laid out to surround a transfer chamber so that various processes are implemented in ambient conditions isolated from the atmosphere with the intention of preventing the contamination of substrate surface and improving the quality of semiconductor devices.

A thermal process chamber of cluster structure including a vacuum load-lock chamber, nitride film deposition chamber, oxidation/annealing chamber, amorphous silicon film deposition chamber, and wafer vapor cleaning chamber, all connected through gate valves around a vacuum chamber equipped with a wafer transfer interface mechanism for carrying a wafer, and processing the wafer in different ambient conditions under control of wafer surface condition is described in the article entitled "Innovative Semiconductor Processing Technology in 1994" in the supplement of monthly publication "Semiconductor World", pp. 237–242, particularly in FIG. 5 on page 241.

FIGS. 2A and 2B are brief plan views of the prior art apparatus, which mainly consists of a transfer chamber 21, process chambers 22 through 29, and a substrate carriage means 32. FIG. 2A shows the apparatus, with the canopy over the transfer chamber 21 being removed, in which the carriage means 32 holding a substrate 31 is directed to face a process chamber 26. FIG. 2B shows the transfer chamber 21 and process chamber 26, with their canopies being removed, in which the carriage means 32 carries a substrate 31 into/out of the process chamber 26. The transfer chamber 21 has its interior kept at a constant vacuum state of $10^{-6}$ torr, while each process chamber undergoes the evacuation of gas down to a high vacuum state of $10^{-8}$ torr and thereafter regains the same ambient condition as of the transfer chamber at each traffic of substrate.

For the conveyance of a substrate between chambers of different ambient conditions, there is known a means of carrying a substrate on a holder through a communication corridor, prior evacuation chamber, and communication corridor, as described in Japanese patent publication JP-A-Sho-62-147726.

However, the above-mentioned prior art multiprocessing system, in which the process chambers are isolated from the transfer chamber through the gate valves, necessitates a preparation time for equalizing the interior pressure of the process chamber to the pressure of the transfer chamber at each traffic of substrate, resulting in a degraded throughput. It further involves a technical problem of the overhead time for setting up the ambient condition and stabilizing the processing condition in the process chamber at each exchange of substrates.

The above-mentioned prior art of carrying a substrate into/out of process chambers while retaining individual ambient conditions in the chambers involves a technical problem of the contamination of the substrate on the holder due to the gas leaking from the process chamber or transfer chamber into the prior evacuation chamber through the clearance between the communication corridor and substrate holder.

SUMMARY OF THE INVENTION

The present invention is intended to solve the foregoing prior art problems, and its object is to provide a semiconductor device fabrication apparatus capable of carrying a substrate between the transfer chamber and process chamber having different ambient conditions while retaining the ambient conditions in these chambers, thereby achieving a high throughput and allowing the substrate to be free from contamination, a method of substrate conveyance used for the apparatus, and a high-quality semiconductor device based on the absence of substrate contamination.

In order to achieve the above objective, the inventive method of carrying a substrate from a transfer chamber to a process chamber, which abut on each other and have different ambient conditions, includes at least the steps of carrying the substrate into/out of the process chamber, while retaining the ambient condition in the process chamber, and implementing a prescribed process for the substrate in the process chamber.

The inventive method of carrying a substrate from a transfer chamber to a process chamber, which abut on each other and have different ambient conditions, includes at least the steps of carrying the substrate into/out of the process chamber by equalizing the ambient condition in a movable buffer chamber which encloses the substrate to the ambient condition in the process chamber, and implementing a prescribed process for the substrate in the process chamber. The inventive method of carrying a substrate from a transfer chamber to multiple process chambers, which abut on each other and have different ambient conditions, includes at least the steps of carrying the substrate into/out of process chambers by using a buffer chamber shared by all process chambers, and implementing prescribed processes for the substrate in the process chambers. The inventive method of carrying a substrate from a transfer chamber to process chambers, which abut on each other have different ambient conditions, includes the steps of forming a buffer space which faces the opening of a process chamber and provides the hermetic sealing for the substrate and substrate carriage means against the ambient condition in the transfer chamber, evacuating and gas-feeding the buffer space thereby to set up the same ambient condition as of the process chamber that the buffer space faces, opening the shutoff means of the process chamber and carrying the substrate into the process chamber, drawing the carriage means back to the buffer space and closing the process chamber, evacuating and gas-feeding the buffer space thereby to set up the same ambient condition as of the transfer chamber, and repeating the step of buffer space formation for other process chambers to provide the hermetic sealing against the transfer chamber and carrying the substrate into these process chambers sequentially while retaining the ambient conditions in these process chambers independently from the ambient condition in the transfer chamber.

The inventive semiconductor device fabrication apparatus having one or more process chambers and a transfer chamber, which abut on each other have different ambient conditions, includes within the transfer chamber a means of carrying a substrate and a buffer means which encloses the carriage means in a state of hold of the substrate, and further includes at least a drive means which positions the buffer means to face the opening of an arbitrary process chamber, means of connecting the buffer means to the opening of the process chamber airtightly, means of closing the opening of the process chamber, means of evacuating the buffer means, transfer chamber and process chambers of gases independently, means of feeding prescribed gases to the buffer means, transfer chamber and process chamber independently, and control means for controlling the driving of the buffer means, the substrate conveyance of the carriage means, the movement of the carriage means, the opening/closing of the connecting means, the opening/shutting of the shutoff means, the evacuation of the gas evacuation means, and the feed of the gas feed means.

The inventive semiconductor device fabricated by being carried between the transfer chamber and various process chambers, which abut on each other and have different ambient conditions, is produced from a substrate which undergoes a number of processes by being carried from one process chamber to another by way of the transfer chamber in a state of retention of ambient conditions in the process chambers and transfer chamber independently.

At the conveyance of a substrate through the opening between the transfer chamber and a process chamber which have different ambient conditions, the substrate and carriage means are placed in the same ambient condition as of the process chamber inside the buffer means which is isolated in ambient condition from the transfer chamber, and thereafter the shutoff means of the process chamber is opened to carry the substrate into or out of the process chamber. Accordingly, the substrate and carriage means have the same ambient condition as of the process chamber, and the ambient condition of the process chamber is not varied. After the substrate is taken out of the process chamber, the shutoff means is closed, the buffer means is set up to the same ambient condition as of the transfer chamber, the buffer means is moved to face another process chamber, and the buffer means is set up to the same ambient condition as of the other process chamber, and so on, whereby it is possible to carry the substrate between the process chambers and transfer chamber while retaining their ambient conditions independently.

The inventive scheme enables the conveyance of substrates without equalizing the ambient conditions in individual process chambers to the condition in the transfer chamber, eliminating the overhead time of condition matching. It eliminates the time for setting up the ambient conditions in the transfer chamber and process chambers. It does not vary significantly the ambient condition in each process chamber, and therefore can keep the processing stable. It prevents the mixing of contaminant gases created in other process chambers or transfer chamber by way of the communication corridor. In consequence, the inventive method and apparatus for semiconductor device fabrication accomplish high-quality semiconductor devices at high throughput and low cost.

DESCRIPTION OF THE PREFERRED EMBODIMENTS

Embodiments of the present invention will be explained in detail.

Figure 1A:
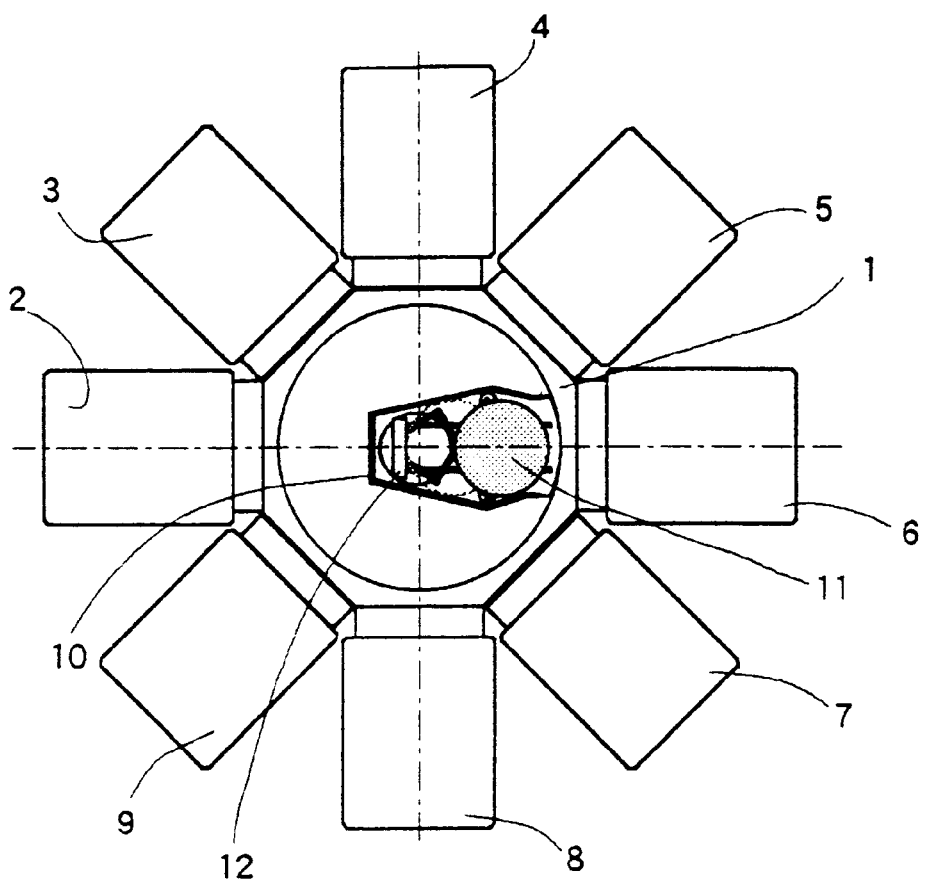
FIGS. 1A and 1B are schematic sectional views of the semiconductor device fabrication apparatus based on an embodiment of this invention.
Figure 1B:
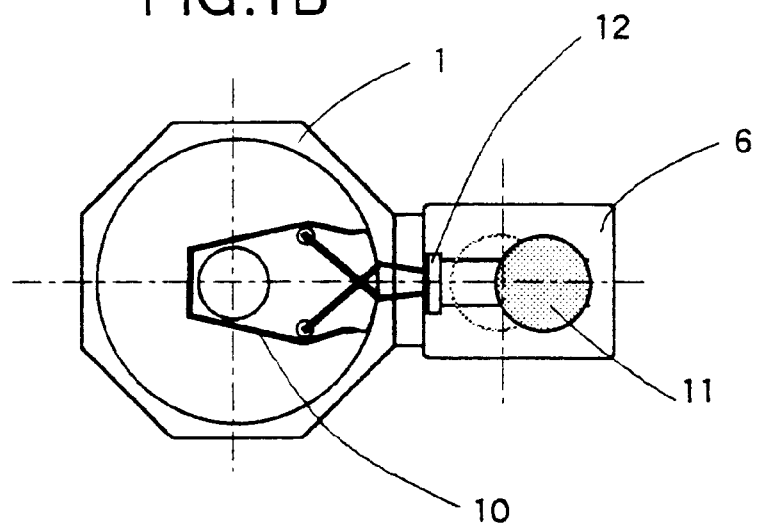
Figure 2A:
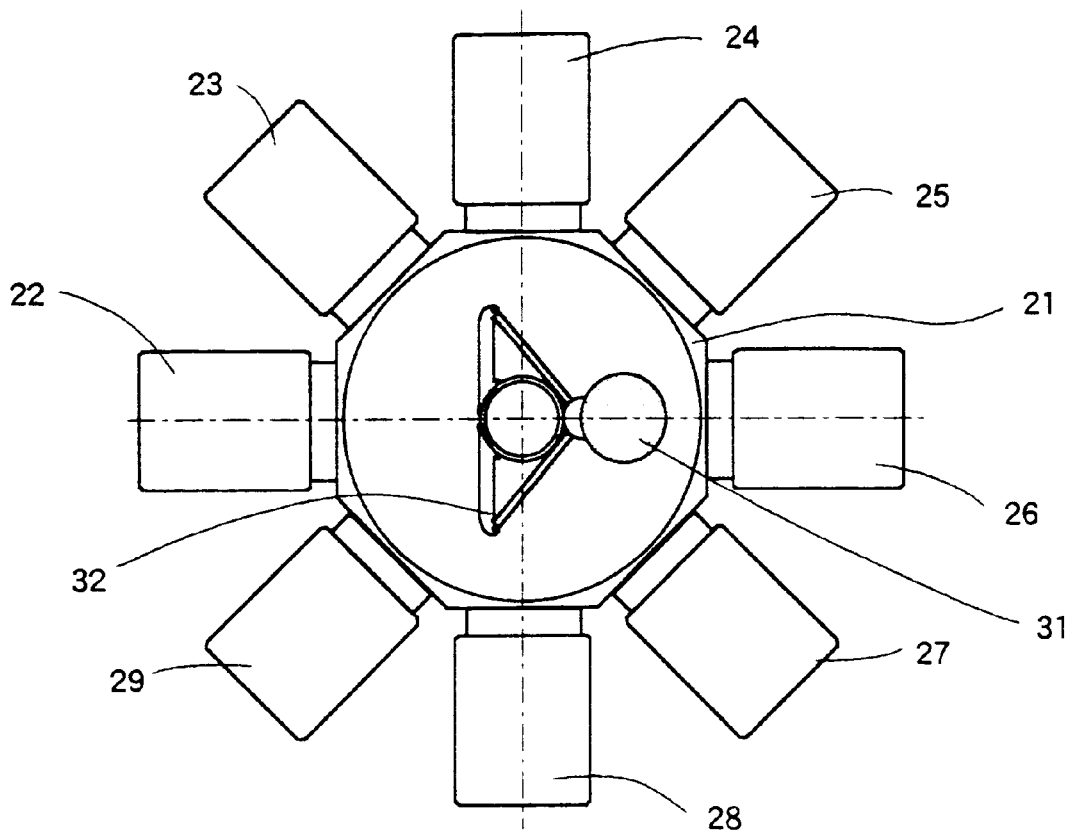
FIGS. 2A and 2B are schematic plan views of the semiconductor device fabrication apparatus based on the prior art.
Figure 2B:
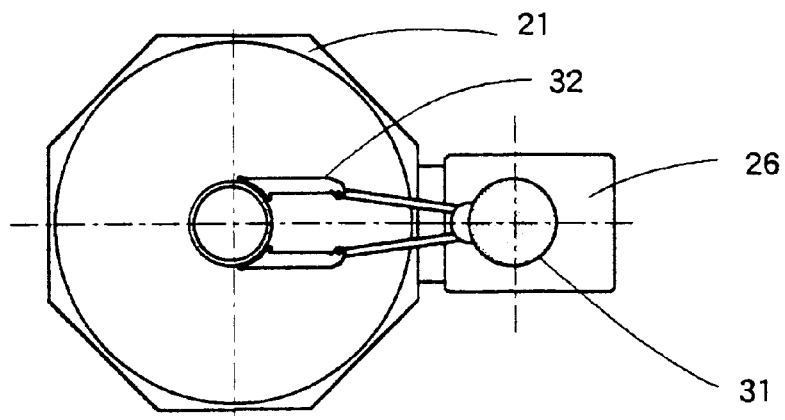

FIGS. 1A and 1B show the semiconductor device fabrication apparatus based on the first embodiment of this invention. The apparatus mainly consists of a transfer chamber 1, process chambers 2 through 9, a buffer chamber 10, and a substrate carriage means 12. FIG. 1A is a top view of the apparatus, with the canopy over the transfer chamber 1 and buffer chamber 10 being removed, showing the carriage means 12 holding a substrate 11 directed to face a process chamber 6. FIG. 1B shows the transfer chamber 1 and process chamber 6, with their canopies being removed, showing the carriage means 2 driven into the process chamber 6 to place or take up a substrate 11. Among the process chambers 2–9, the chambers 2 and 6 are used for the sputtering process, the chamber 3 is used for the tungsten chemical vapor deposition (CVD) process, the chamber 4 is used for the tungsten sputtering process, the chamber 5 is used for the aluminum sputtering process, the chamber 7 is used for the degassing process, the chamber 8 is used for the etching process, and the chamber 9 is used as the load-lock chamber. The load-lock chamber, which is fed with the inert gas at a pressure higher by about 50 torr than the atmosphere or fed with the same gas of the transfer chamber at a reduced pressure, can load and unload a piece of substrate or pieces of substrates at once into/out of the apparatus. The transfer chamber 1 is kept at a vacuum state of $10^{-6}$ torr, and the buffer chamber 10 is given the same ambient condition as of the adjoining process chamber or given the same ambient condition as of the transfer chamber 1 when it is moved to other process chamber.

The inventive apparatus needs only one evacuation system for one movable buffer chamber which is shared by all process chambers, in contrast to the prior art apparatus which, in case it carries a substrate between the transfer chamber and process chambers by way of the communication corridor and prior evacuation chamber, necessitates evacuation systems equal in number to the process chambers. Accordingly, the inventive scheme reduces the number of evacuation systems significantly and thus reduces the cost of facility as compared with the prior art apparatus. Moreover, the inventive apparatus does not need a passage means between the transfer chamber and process chambers and thus does not need spaces for them, and accordingly it can have a reduced installation area (footprint).

Although in the semiconductor device fabrication apparatus of the foregoing embodiment, the process chambers are laid out on a circle to surround the transfer chamber and the buffer chamber is designed to turn in the transfer chamber, an alternative structure is to lay out the process chambers along a straight line or arbitrary curve, with the buffer chamber being moved along the line or curve by a guide means and moving means.

Figure 3A:
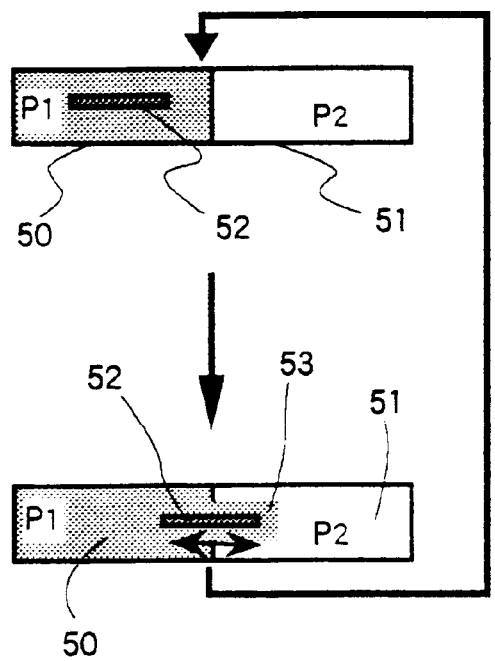
FIGS. 3A and 3B are diagrams comparing the performances of the inventive scheme and prior art.
Figure 3B:
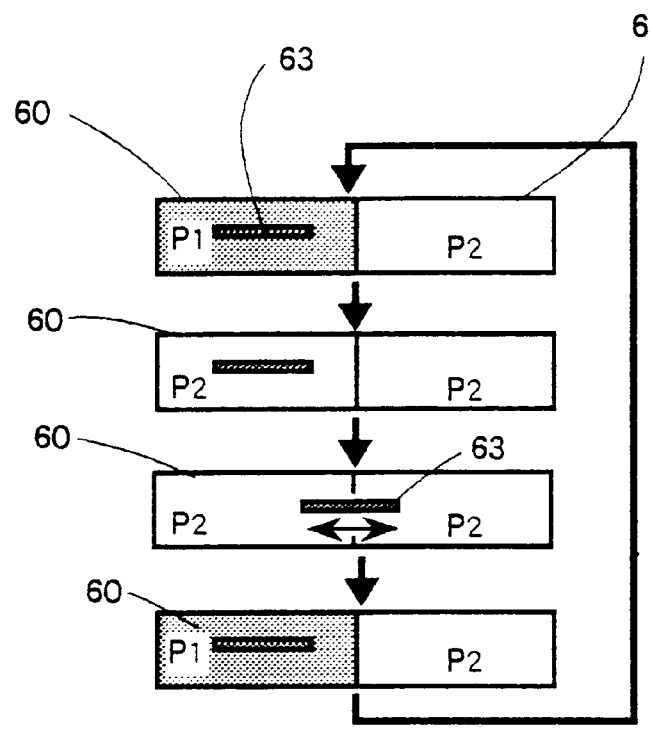

FIGS. 3A and 3B compare the performances of the inventive scheme and prior art. In FIG. 3A of the inventive scheme, the process chamber 50 and transfer chamber 51 are kept at pressures P1 and P2, respectively, and a substrate 52 is carried into the process chamber 50 by conditioning the buffer chamber 53 to have the pressure P1. Accordingly, the substrate is placed in the process chamber for processing in a short time (about 10 seconds) which is expended merely for adjusting the gas pressure of the buffer chamber of small capacity.

In FIG. 3B of the prior art, the process chamber 60 of pressure P1 is pumped out, a substrate 63 is carried into the process chamber 60 after the pressure becomes equal to P2 of the transfer chamber 61, and the process chamber 60 is conditioned to have the ambient condition for processing. Accordingly, it takes a time (about 30 seconds) for pumping the process chamber of large capacity plus a time (about 30 seconds) expended for the restoration of ambient condition for processing, i.e., it takes a long overhead time (about 60 seconds).

In a trend of larger semiconductor substrates for the fabrication of high-performance semiconductor devices, the single wafer treatment is inevitable. The overhead time of about 60 seconds of the prior art takes up a large proportion of the operation cycle time in which the processing time is generally 60–90 seconds, and this situation is serious from the viewpoint of throughput.

In contrast, the inventive scheme of carrying a substrate into/out of process chambers by setting up the ambient condition in a small buffer chamber in about 10 seconds is capable of readily improving the throughput. The inventive scheme allows to maintain steadily the ambient condition in the process chambers by eliminating the need of restoration of the ambient condition for each process, and consequently enables the detection of abnormal phenomena attributable to a small fluctuation of ambient condition. As a result, the inventive scheme makes it possible the production of high-quality semiconductor devices at high throughput. The steady ambient condition for each process of individual substrates so that it does not affect the function added by the process, based on this invention is most easily accomplished by equalizing the partial pressure or temperature of processing gas that are influential on the resulting function.

Figure 4A:
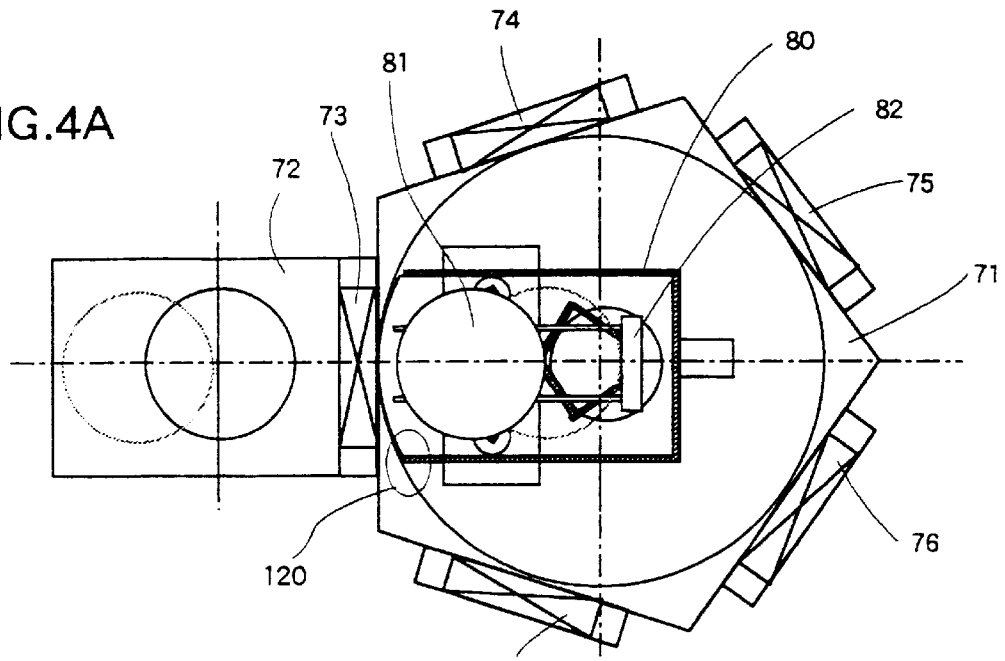
FIGS. 4A,4B and 4C are internal views of the semiconductor device fabrication apparatus based on a second embodiment of this invention.
Figure 4B:
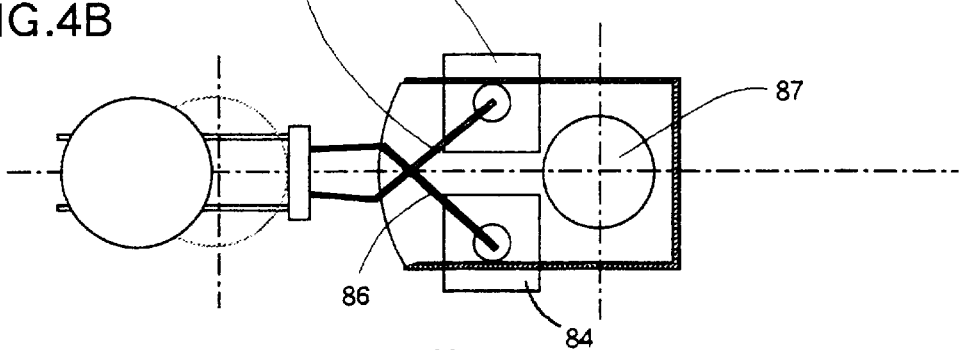
Figure 4C:
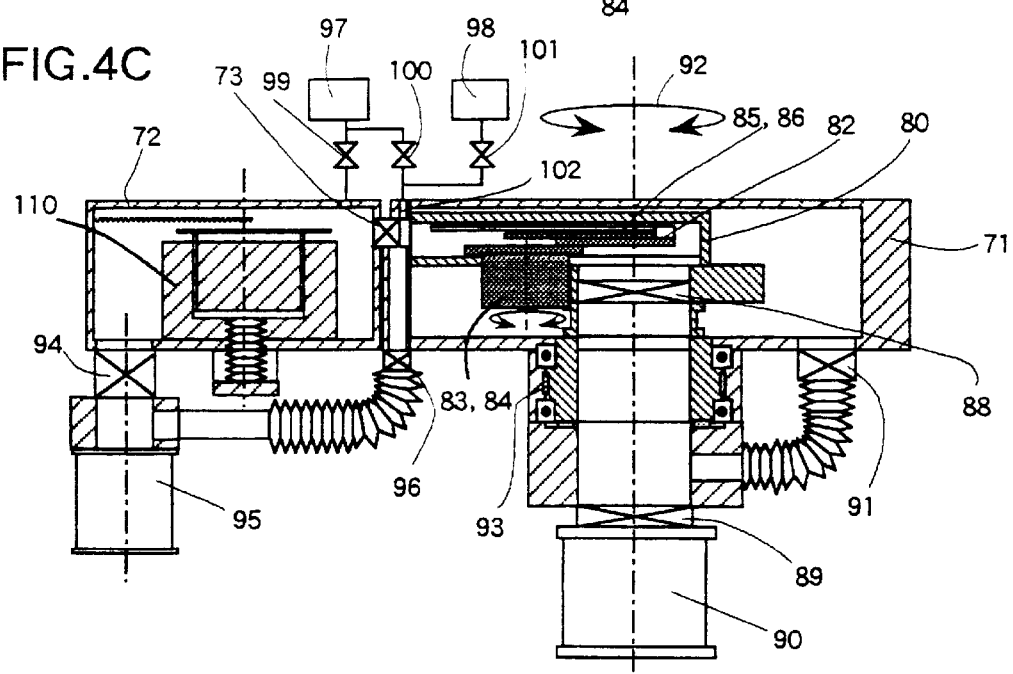

FIGS. 4A–4C show the semiconductor device fabrication apparatus based on the second embodiment of this invention. The apparatus mainly consists of a pentagonal transfer chamber 71, five process chambers 72, a buffer chamber 80, and a substrate carriage means 82. FIG. 4A is a top view of the apparatus, FIG. 4B shows part of the apparatus, with the carriage means being driven into the process chamber 72, and FIG. 4C is a vertical cross-sectional diagram of the apparatus.

The process chamber 72 can communicate with the transfer chamber 71 through a valve 73, and the remaining process chambers (not shown) can communicate with the transfer chamber 71 through the respective valves 74,75,76 and 77. The number of process chambers is not confined to five of this embodiment, but it is arbitrary with the provision of a transfer chamber shaped and dimensioned properly. For the apparatus of this embodiment which is designed to treat substrates having a diameter of 200 mm, the transfer chamber 71 has an inner diameter of 600 mm and a height of 200 mm, the process chamber 72 has a depth of 450 mm, and the buffer chamber 80 has a height of 30 mm.

The carriage means 82, which can hold two pieces of substrates on the upper and lower sides thereof as will be explained later, takes up a processed substrate which already exists on a wafer stage means 110 in the process chamber, and places an unprocessed substrate on the wafer stage means 110. The carriage means 82 of "frog-leg" mechanism is made up of drive means 83 and 84 and links 85 and 86 to carry substrates.

The buffer chamber 80 is pumped out from its opening 87 by an evacuation means 90 through a conductance valve 88 and a valve 89. The transfer chamber 71 is pumped out through a valve 91 by the evacuation means 90 independently of the buffer chamber 80. The buffer chamber 80 is turned within the transfer chamber 71 as shown by the arrow 92 by a drive means (not shown) thereby to face an intended process chamber. The interior of the buffer chamber 80 is kept airtight against the external atmosphere by a guide means 93 which is based on magnetic fluid sealing. The process chamber 72 is isolated by the valve 73 from the transfer chamber 71 and buffer chamber 80, except at the time of traffic of a substrate.

The process chamber 72 is pumped out through a valve 94 by an evacuation means 95. The buffer chamber 80 is pumped out through a valve 96 by the evacuation means 95 after it has been given the same ambient condition as of the process chamber 72. The process chamber 72 and buffer chamber 80 are fed with prescribed gas from a gas supply means 97 by way of flow control means 99 and 100 so that the intended ambient conditions are maintained. The buffer chamber 80 is further fed with inert cleaning gas from an inert gas supply means 98 by way of a flow control means 101. Specifically, a jet of compressed high-purity nitrogen gas from the inert gas supply means 98 is introduced to the buffer chamber 80 through a supply means 102 on the ceiling of the transfer chamber 71 at the upstream position of the buffer chamber 80 so that a turbulent gas flow blowing toward the lower opening 87 which communicates with the evacuation means can remove contamination particles on the interior wall of the buffer chamber and the surface of carriage means in physical cleaning. The buffer chamber 80 can also be cleaned in advance in chemical cleaning by use of fluorine gas such as $CF_4$, $CHF_3$ and $SF_4$. The buffer chamber 80 can be heated for the promotion of degassing after cleaning.

It is also possible to introduce a jet of gas to the buffer chamber 80 after it has been evacuated to have a negative pressure relative to the gas source so that the interior is cleaned in physical and chemical cleanings.

Based on the conduction of the cleaning process by introducing a jet of pressurized gas into a small buffer chamber so that contamination is blown out of the chamber, the inventive scheme prevents the accumulation of contamination particles in the buffer chamber.

Furthermore, it is possible to use plasma and photoexcitation of gas in the buffer chamber or resistance heating and radiative heating of the interior so that gas molecules and particles come off the interior wall and the surface of carriage means, and use the Brownian movement, electrostatic and electrophoresis of gas molecules so that molecules and particles in the slow stream near the wall are brought to the main gas stream, thereby enhancing the cleaning effect of the buffer chamber. The inventive scheme can conduct these cleaning processes in a short time owing to the small capacity of the buffer chamber.

These cleaning processes are controlled in terms of the flow rate or flow velocity of the gas jet and the evacuation speed based on the monitoring of the distribution of particle diameters with a measuring device provided at the evacuation port of the buffer chamber or the monitoring of the partial pressure with a mass analyzer. These monitoring operations tell the necessity of cleaning process accurately, and the semiconductor device fabrication apparatus can be used efficiently while preventing the damage by the excessive cleaning operation.

Based on the pulse drive of the carriage means relative to its home position, which does not use a feedback system, the servo system can be simplified. It is also possible for the carriage drive means to employ a feedback system which achieves the optimal acceleration and deceleration of the carriage means, thereby minimizing the substrate transfer time.

The carriage means carries a substrate, with its processing surface facing upward in general. In occasional cases in connection with the structure of process chambers, a substrate may be carried with its processing surface facing downward or carried in vertical attitude. The vertical substrate conveyance is effective to reduce the installation area(foot print) of the apparatus, particularly in the case of the single wafer treatment for substrates having a large diameter.

Figure 5:
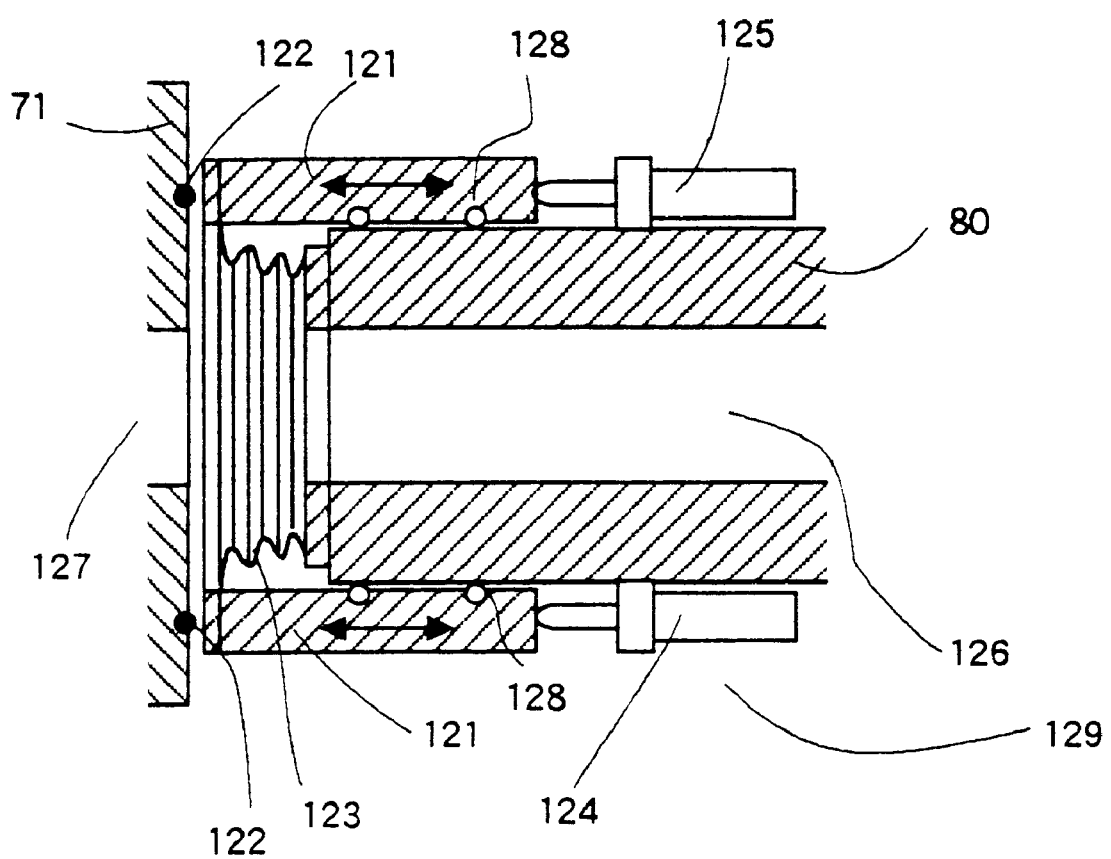
FIG. 5 is a partially enlarged diagram showing the details of the sealing mechanism of the inventive apparatus.

FIG. 5 shows the details of the sealing mechanism of the inventive apparatus that is the portion 120 enclosed by the circle in FIG. 4A. This mechanism is intended to allow the communication between the rotary buffer chamber 80 and a process chamber 72 through the opening 127, while holding the buffer interior 126 airtight against the interior 129 of the transfer chamber 71.

In operation, with the buffer chamber 80 facing the opening 127 of the transfer chamber which communicates with the process chamber, seal means 121 borne by guide means 128 are moved by drive means 124 and 125 in the direction indicated by the arrow to come close or in contact with seal members 122 on the transfer chamber 71 through a flexible member 123 such as a bellows. In carrying a substrate into the process chamber by the carriage means, the seal means 121 are driven to come in contact with the the seal members 122. In turning the buffer chamber, with the carriage means being retracted in it, the seal means 121 are drawn to provide a certain clearance from the seal members 122.

FIGS. 6A–6F show the substrate carrying operation based on this invention. The upper section and lower section of each figure are a internal top view and side view, respectively, of the apparatus. The figures show the sequential operation, in which an unprocessed substrate is carried into a process chamber and placed on the wafer stage means 110, and a processed substrate is taken out of the process chamber. In this example of operation, the carriage means moves along a horizontal axis to carry an unprocessed substrate into and processed substrate out of the process chamber, as in the case of the carriage means 82 shown in FIG. 4A. This arrangement of substrate carrying operation is particularly suitable for process chambers having wafer stage means 110 which move solely along a vertical axis.

The wafer stage means 110 has a susceptor 130 which supports a substrate on at least three points (4-point suscepter is shown in FIGS. 6A–6F), and it is moved up and down as shown by the arrow 134 along a vertical axis by a drive means (not shown). This simple structure works reliably in handling substrates in various ambient conditions of processes. The carriage means 82 has two forks 131 and 132 so that it can take up a processed substrate 140 and place an unprocessed substrate 141 by a single access to the interior of process chamber. The upper fork 132 extends more by length r toward the process chamber than the lower fork 131, with the length r being preferably set virtually equal to the radius of the substrate to be treated for the sake of compactness. The forks 131 and 132 have their profiles designed so that the forks and the suscepter 130 do not interfere with each other in their movement. The carriage means 82 can have various manners of linear motion as will be explained later, besides the "frog-leg" mechanism mentioned previously.

Next, the sequential substrate carrying operation of the foregoing mechanism will be explained.

Figure 6A:
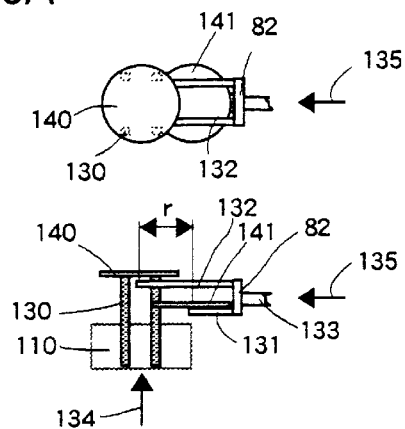
FIGS. 6A through 6F are diagrams showing the sequential substrate carrying operation based on this invention.

In the first case shown in FIG. 6A, a processed substrate 140 is in the process chamber, and a unprocessed substrate 141 lies on the lower fork 131 of the carriage means 82. The suscepter 130 raises the substrate 140 on the wafer stage means to the height above the upper fork 132. The carriage means 82 is moved ahead as shown by the arrow 135 up to the position on substrate 141 that is short of distance by r from the mount position of the wafer stage. The suscepter 130 is lowered, and the substrate 140 lies on the upper fork 132. The suscepter 130 is further lowered below the substrate 141.

Figure 6D:
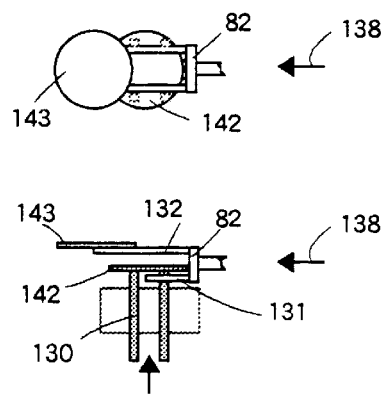
Figure 6B:
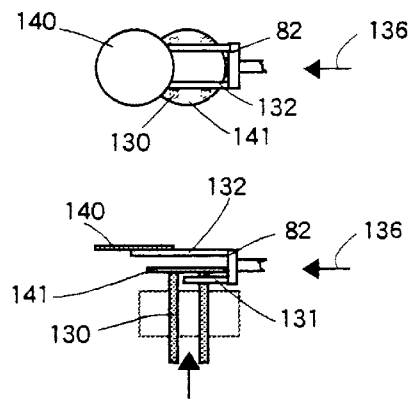

Next, in FIG. 6B, the carriage means 82 is advanced by distance r as shown by the arrow 136. The suscepter 130 is raised, and the substrate 141 lies on the suscepter 130. The suscepter 130 is further raised, and the substrate 141 is pushed up from the lower fork 131.

Figure 6E:
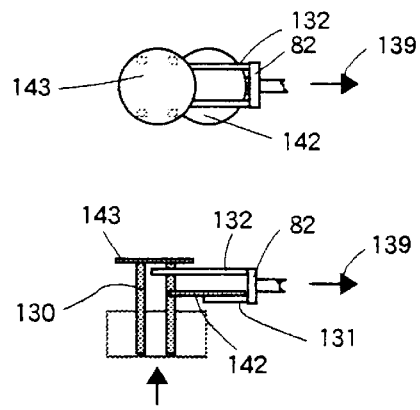
Figure 6C:
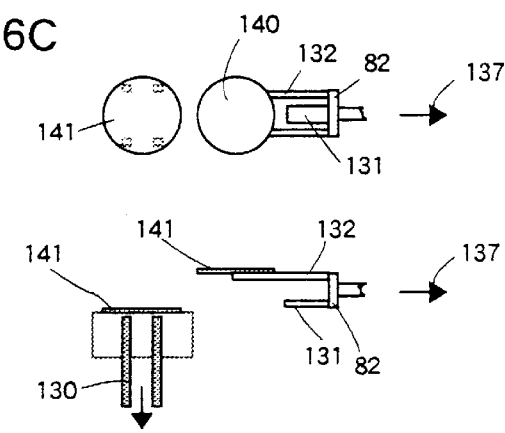

Next, in FIG. 6C, the carriage means 82 is retracted as shown by the arrow 137, and the substrate 140 is taken out of the process chamber and carried into the buffer chamber. The suscepter 130 is lowered, and the substrate 141 lies at the mount position of the wafer stage means 110.

In the second case shown in FIG. 6D, a processed substrate 142 is in the process chamber, and an unprocessed substrate 143 lies on the upper fork 132 of the carriage means 82. The suscepter 130 raises the substrate 142 on the wafer stage means up to the height where it is clear of the lower fork 131. The carriage means 82 is advanced as shown by the arrow 138 up to the position on substrate 143 that is ahead by r of the mount position of the wafer stage. The suscepter 130 is lowered, and the substrate 142 lies on the lower fork 131. The suscepter 130 is further lowered below the substrate 141.

Next, in FIG. 6E, the carriage means 82 is retracted by distance r as shown by the arrow 139. The suscepter 130 is raised, and the substrate 143 lies on the suscepter 130. The suscepter 130 is further raised, and the substrate 143 is pushed up from the upper fork 132.

Figure 6F:
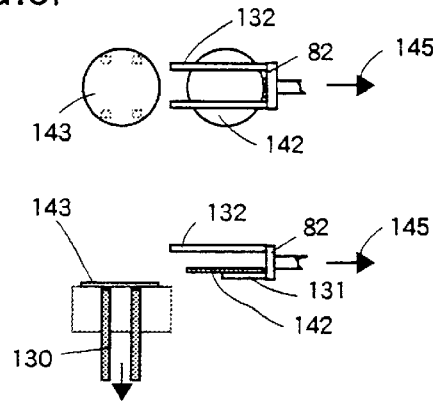

Next, in FIG. 6F, the carriage means 82 is further retracted as shown by the arrow 145, and the substrate 142 is taken out of the process chamber and carried into the buffer chamber. The suscepter 130 is lowered, and the substrate 143 lies at the mount position of the wafer stage means 110.

In this manner, the inventive scheme enables the conveyance of substrates thereby to replace a processed substrate with an unprocessed substrate in a process chamber based on the horizontal movement of the carriage means 82 for making a single access to the interior of process chamber and the vertical movement of the suscepter 130. On the other hand, when the carriage means 82 has a up/down moving mechanism, substrates can be carried and changed without moving of the suscepter 130 similarly as mentioned.

Accordingly, the inventive scheme eliminates the time expended by the reciprocative turn motion of the carriage means of the prior art in which a processed substrate is taken out of a process chamber and carried into the transfer chamber and next placed in another process chamber, and thereafter an unprocessed substrate is taken out of another process chamber and placed in a certain process chamber.

Figure 7:
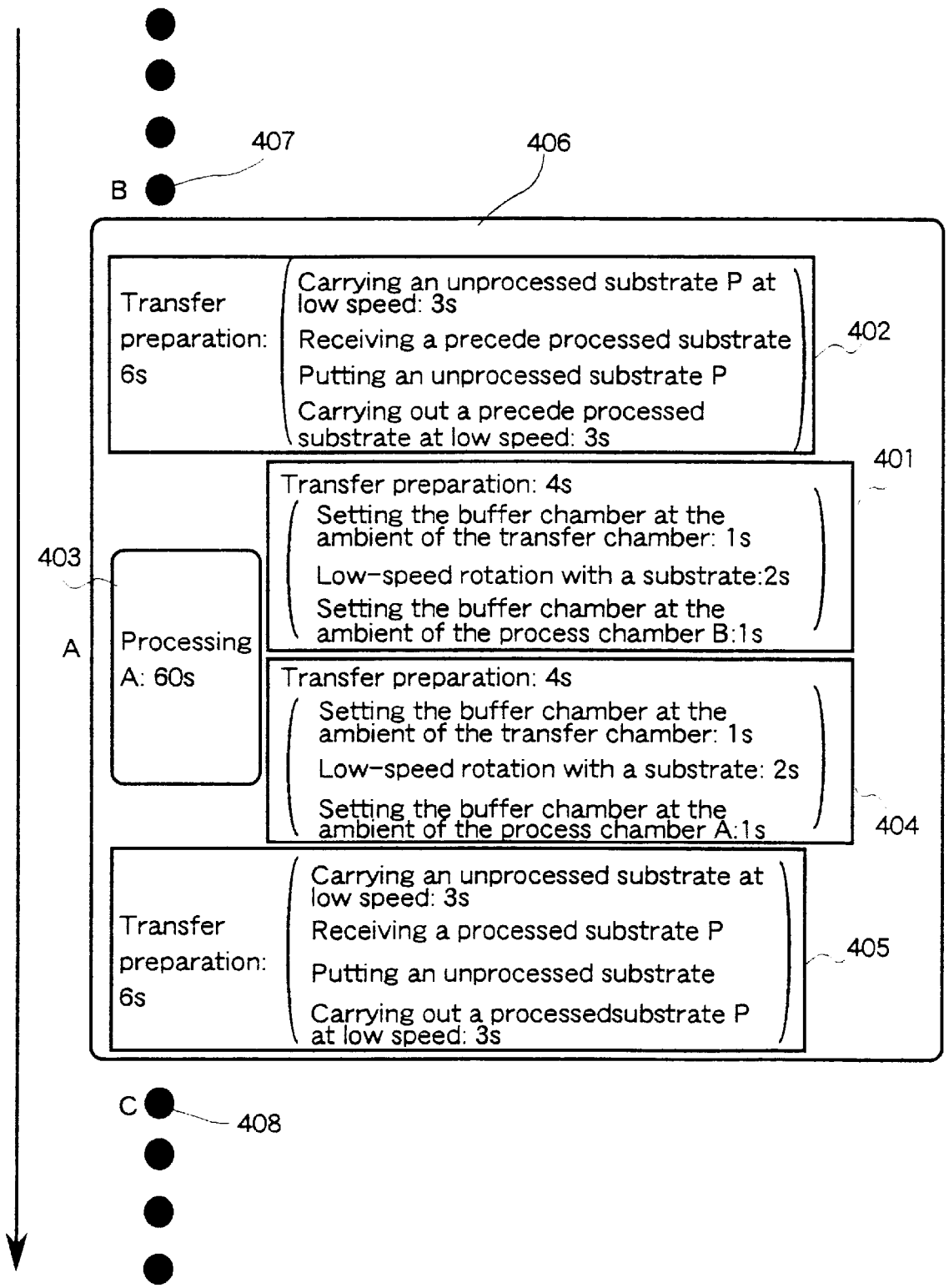
FIG. 7 is a flowchart of the substrate carrying operation and processing based on the inventive scheme.

FIG. 7 shows the treatment of substrate based on the inventive method and apparatus. An operation 406 for a process 403 conducted for a substrate P in a process chamber A will mainly be explained in conjunction with the preceding operation 407 in a process chamber B and succeeding operation 408 in a process chamber C.

Briefly, a processed substrate in the process chamber A is taken out, the substrate P which has come out of the chamber B is placed in the chamber A, and after processing it is carried into chamber C.

Indicated by solid circles are preceding and succeeding operations, with their process conditions being varied from the condition in the operation 406. The operations proceed downwardly in the figure as shown by the arrow.

The operation 406 includes a transfer preparation step 401 for equalizing the ambient condition in the buffer chamber and process chamber A, a transfer preparation step 402 for carrying the unprocessed substrate A into the chamber A, a processing step 403, a transfer preparation step 404 for equalizing the ambient condition in the buffer chamber and process chamber A, and a transfer preparation step 405 for carrying the processed substrate P out of the chamber A.

The transfer preparation steps 401 and 404 are implemented concurrently with the process 403, and the transfer preparation steps 402 and 405 are implemented in series to the process 403. These serial transfer preparation steps do not contribute directly to the fabrication process, and their time, as shown in the figure, expended mainly for the movement of carriage means and setup of ambient condition is a negative factor of the throughput. Accordingly, the carriage means has its moving speed set lower when it holds a substrate in order to prevent the vibration, or otherwise set higher.

The operation will be explained in more detail with reference to the supplemental diagram of FIG. 24. In parallel to the process in chamber B for the substrate P, a transfer preparation step is implemented thereby to equalize the ambient condition in the buffer chamber and transfer chamber, turn the buffer chamber to face the process chamber B, and equalize the ambient condition in buffer chamber to the condition in process chamber B.

On completion of processing for the substrate P in the chamber B, the transfer preparation step is implemented thereby to open the valve and carry an unprocessed substrate into the process chamber B at lower speed, take up the substrate P from the wafer stage means of the chamber B, place the unprocessed substrate on it, and carry the substrate P into the buffer chamber at lower speed and close the valve. The process chamber B is now ready to process the next unprocessed substrate.

Figure 24:
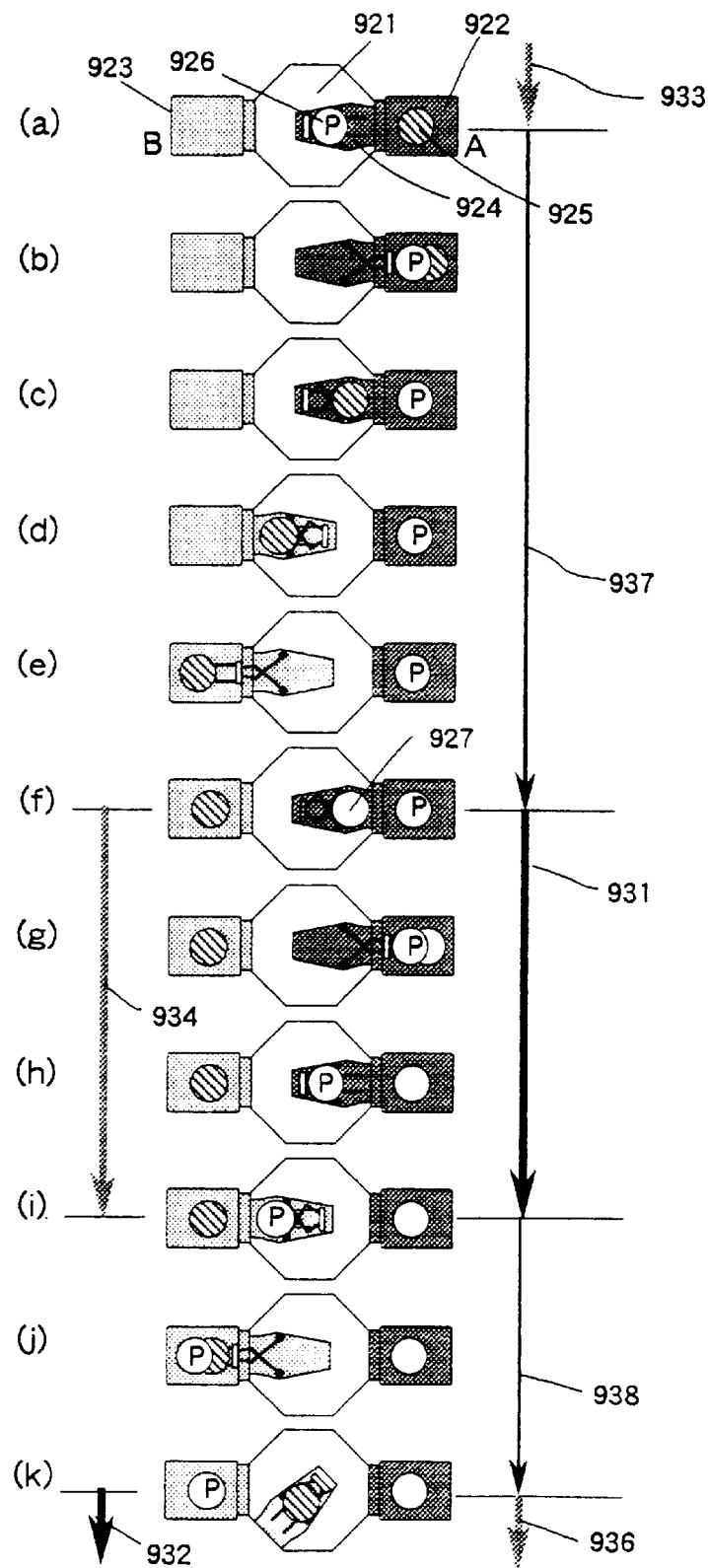
FIG. 24 is a supplemental diagram showing the operation of the inventive apparatus.

The buffer chamber 924 which contains the substrate 926 (P) undergoes the transfer preparation step 401 thereby to have the same ambient condition as of the transfer chamber, turns to face the process chamber 922 (A), and have the same ambient condition as of the chamber 922 (A), as shown by (a) in FIG. 24.

On completion of the process 403 for the precede substrate 925 in the chamber A, the transfer preparation step 402 is implemented thereby to open the valve and carry the substrate P into the chamber A at lower speed, take up the precede substrate from the wafer stage means in the chamber A, and place the substrate P on the stage, as shown by (b).

After the precede substrate is carried to the buffer chamber at lower speed and the valve is closed, the substrate P undergoes the process 403 in the chamber A, as shown by (c). The precede substrate held in the buffer chamber as shown by (d) is carried to the next process chamber in a transfer preparation step as shown by (e), and rendered another process as shown by (f).

During the process 403, the buffer chamber, in which the carriage means holds an unprocessed substrate 927 to be processed in the chamber A, undergoes the transfer preparation step 404 thereby to have the same ambient condition as of the transfer chamber, turns to face the process chamber A, and have the same ambient condition as of the chamber A, as shown by (f).

On completion of the process 403 for the substrate P, the transfer preparation step 405 is implemented thereby to open the valve and carry an unprocessed substrate into the process chamber A at lower speed, take up the substrate P on the wafer stage means in it, and place the unprocessed substrate on the stage, as shown by (g). After the substrate P is carried to the buffer chamber at lower speed and the valve is closed, the unprocessed substrate undergoes the process 403 in the chamber A, as shown by (h). Subsequently, the buffer chamber holding the substrate P undergoes a transfer preparation step thereby to have the same ambient condition as of the transfer chamber, turns to face the process chamber C, and have the same ambient condition as of the chamber C, as shown by (i). On completion of processing for the precede substrate in the chamber C, a transfer preparation step is implemented to carry the substrate P into the process chamber C as shown by (j), and the next process takes place in it, with the precede substrate held in the buffer chamber being carried to other process chamber, as shown by (k) in FIG. 24.

By repeating the foregoing sequential treatment, semiconductor devices are fabricated on the substrate P.

On completion of processing for the precede substrate in a process chamber, the valve is opened, an unprocessed substrate is carried into the chamber at lower speed, the processed substrate on the wafer stage means is taken up, the unprocessed substrate is placed, the taken-up processed substrate is carried into the buffer chamber at lower speed, and the valve is closed as shown by step 402, and the process is started immediately. The total overhead time expended by the transfer preparation steps 401,402,404 and 405 is 20 seconds. In the case of continuous substrate processing, in which the transfer preparation steps 401 and 404 take place concurrently with the step of process, their overhead time of 4 plus 4 seconds is absorbed in the processing time, resulting in a reduced total overhead time of 12 seconds which is attributed to the steps 402 and 405.

Among the arrows each representing a step in FIG. 24, indicated by 933 is the processing for the precede substrate in the process chamber A, 937 is carry-out of the precede substrate and carry-in of the substrate P to the chamber A,931 is the processing of the substrate P in the chamber A,938 is carry-out of the substrate P from the chamber A and carry-in to the chamber C,932 is the processing of the substrate P in the chamber C,936 is the processing of the next substrate in the chamber A, and 934 is the processing of the next substrate in the chamber C. Throughout the steps, each process chamber has its ambient condition retained, as indicated by the common shading for the chamber.

The maintenance of ambient conditions in the process chambers is not confined to the retention of gas components, gas pressure, gas temperature, plasma, etc., but another possible maneuver is the switching of these ambient conditions depending on the function to be added to the substrate immediately after the substrate is placed in the process chamber.

The selection between the switching of ambient conditions for multiple processes in one process chamber or the transfer of substrate to other process chambers in different steady ambient conditions is obviously based on as to which overhead time expended for the transfer preparation of substrate or for the switching of ambient condition is shorter.

Figure 8:
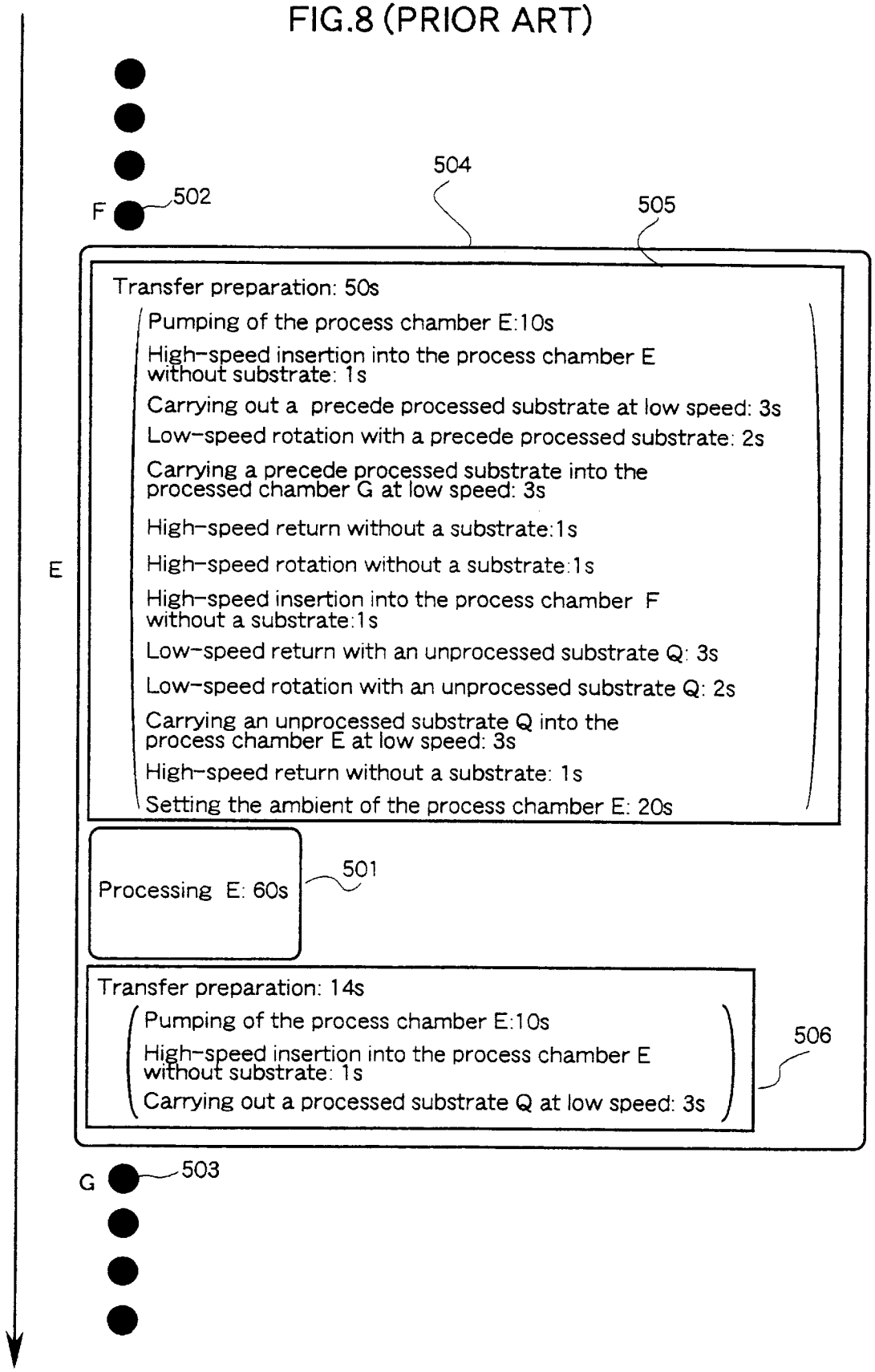
FIG. 8 is a flowchart of the substrate carrying operation based on the prior art.

FIG. 8 shows the treatment of substrate based on the prior art apparatus. An operation 504 for a process 501 conducted for a substrate Q in a process chamber E will mainly be explained in conjunction with the preceding operation 502 in a process chamber F and succeeding operation 503 in a process chamber G.

Briefly, the process chamber E is evacuated of gas and set up to the same ambient condition as of the transfer chamber, and a precede processed substrate is taken out of it and carried into the next chamber G. The substrate Q which has undergone a preceding process in the chamber F is taken out of it, placed in the chamber E, and rendered the process. On completion of the process in the chamber E, the substrate Q is carried into the chamber G for undergoing the succeeding process. Indicated by solid circles are preceding and succeeding operations, with their process conditions being varied from the condition in the operation 504. The operations proceed downwardly in the figure as shown by the arrow.

The operation 504 includes a transfer preparation step 505 for evacuating the process chamber E, carrying the substrate Q into it and setting up the ambient condition, a processing step 501, and a transfer preparation step 506 for evacuating the chamber E and taking out the processed substrate Q.

The transfer preparation steps 505 and 506 are implemented in series to the process 501. These serial transfer preparation steps do not contribute directly to the fabrication process, and their time expended mainly for the movement of carriage means and setup of ambient condition is a negative factor of the throughput. Accordingly, the carriage means has its moving speed set lower when it holds a substrate in order to prevent the vibration, or otherwise set higher.

The operation will be explained in more detail with reference to the supplemental diagram of FIG. 25.

Figure 25:
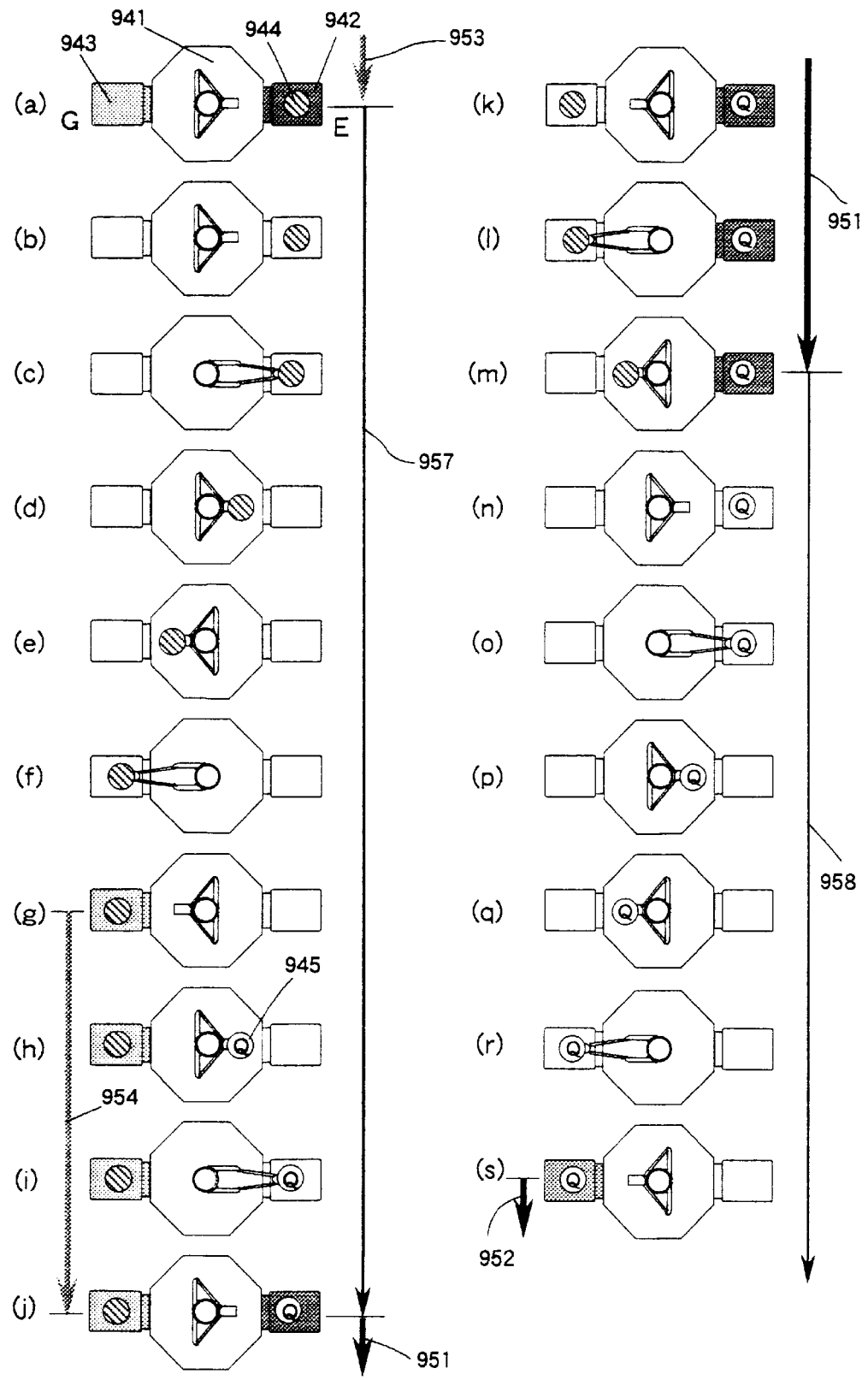
FIG. 25 is a supplemental diagram showing the operation of the prior art apparatus.

In case a precede substrate 944 is present in the process chamber 942 (E) as shown by (a) in FIG. 25, the chamber is evacuated to the same vacuum state as of the transfer chamber 941, as shown by (b). The valve is opened, the carriage means advances into the chamber E at higher speed, it takes up the precede substrate which has been processed as shown by (c), the carriage means retracts in the transfer chamber at lower speed as shown by (d), the carriage means turns at lower speed to face the process chamber 943 G for the next process of the precede substrate as shown by (e), the precede substrate is carried and placed in the chamber G as shown by (f), the valve is closed, the ambient condition is set up and the process is started as shown by (g) in FIG. 25.

Subsequently, the carriage means turns at higher speed to face the process chamber F, it advances into the chamber F at higher speed, it takes up the substrate 945 (Q) which has been processed in chamber F (but not yet processed in chamber E), it retracts to the transfer chamber at higher speed, it turns to face the chamber E at lower speed as shown by (h), and the substrate Q is placed in the chamber E as shown by (i). The carriage means retracts at higher speed, the valve of the chamber E is closed, the ambient condition in chamber E is set up, and the process in chamber E is implemented as shown by (j) in FIG. 25.

The process chamber G is evacuated in order to take out the precede substrate as shown by (k), the carriage means takes up the precede substrate as shown by (l), it retracts in the transfer chamber as shown by (m), and it carries the precede substrate to other process chamber.

On completion of the process in chamber E, the transfer preparation step 506 is implemented to evacuate the chamber E to the same vacuum state as of the transfer chamber as shown by (n). The valve is opened, and the carriage means advances into the chamber E at higher speed, it takes up the processed substrate Q as shown by (o), it retracts in the transfer chamber as shown by (p), it turns to face the chamber G at lower speed for the next process of the substrate Q as shown by (q), and it carries the substrate Q into the chamber G at lower speed as shown by (r). The valve of the chamber G is closed, the ambient condition is set up, and the process in the chamber G is implemented as shown by (s) in FIG. 25.

The prior art apparatus takes 50 seconds after it commences the evacuation of the process chamber on completion of processing for the precede substrate until it sets up another ambient condition in the chamber, and takes another 14 seconds for taking out the processed substrate, i.e., a total transfer preparation time of 64 seconds, as shown in the figure. The overhead time influential on the throughput is 49 seconds which is attributed to the transfer preparation steps 505 and 506.

Among the arrows each representing a step in FIG. 25, indicated by 953 is the processing of the precede substrate in the chamber E, 957 is the evacuation of the process chamber E and carry-out of the precede substrate and carry-in of the substrate Q and setup of ambient condition in the chamber E, 951 is the processing of the substrate Q in the chamber E, 958 is the evacuation of the chamber E and carry-out of the substrate Q and carry-in to the chamber G and setup of ambient condition in the chamber G, 952 is the processing of the substrate Q in the chamber G, and 954 is the processing of the precede substrate in the chamber G. Each process chamber has its ambient condition for processing varied for the traffic of substrate, as indicated by the common shading for the chamber.

Comparing the inventive and prior art operations in FIG. 7 and FIG. 8 reveals that the inventive scheme is capable of reducing the overhead time, which is influential on the throughput, to ⅕ of the prior art.

Figure 20:
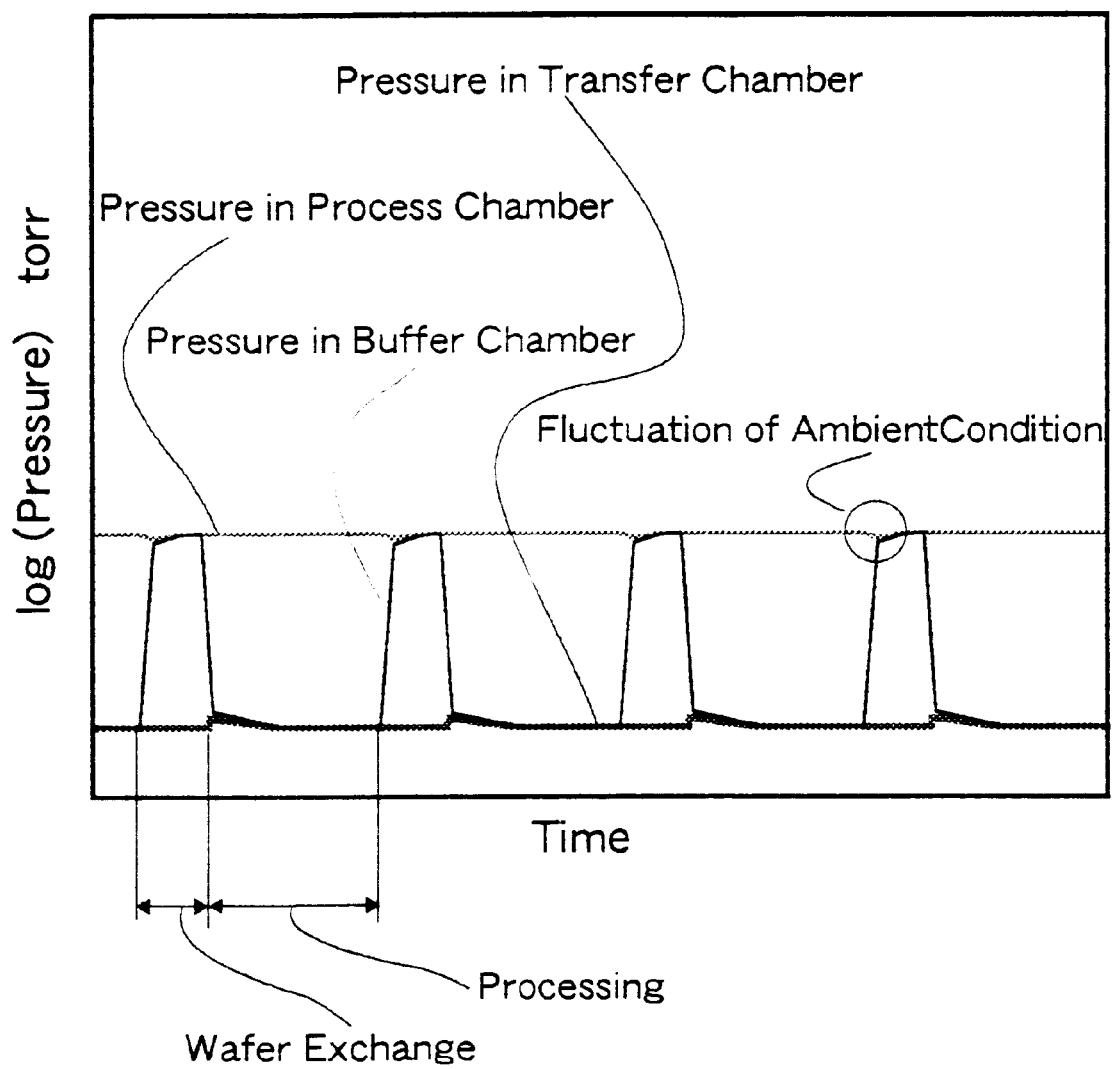
FIG. 20 is a time chart showing the pressure variation in the chambers resulting from the inventive scheme.

The advantage of the present invention will further be explained with reference to FIG. 20 and FIG. 21. FIG. 20 is a measurement result of the inventive apparatus, showing the pressure variation in the process, transfer and buffer chambers on the logarithmic scale along the time axis. The process chamber has an average pressure of 50 torr, and the transfer chamber has an average pressure of $10^{-5}$ torr. Substrates are carried in and out before and after each processing, and the pressure of buffer chamber is varied for these operations, causing the pressure of the processing and transfer chambers to fluctuate within the allowable range. The measurement result reveals that the fluctuation of pressure in the process chamber is as little as several % of the average pressure, proving the accurate maintenance of the ambient condition in the process chamber.

Figure 21:
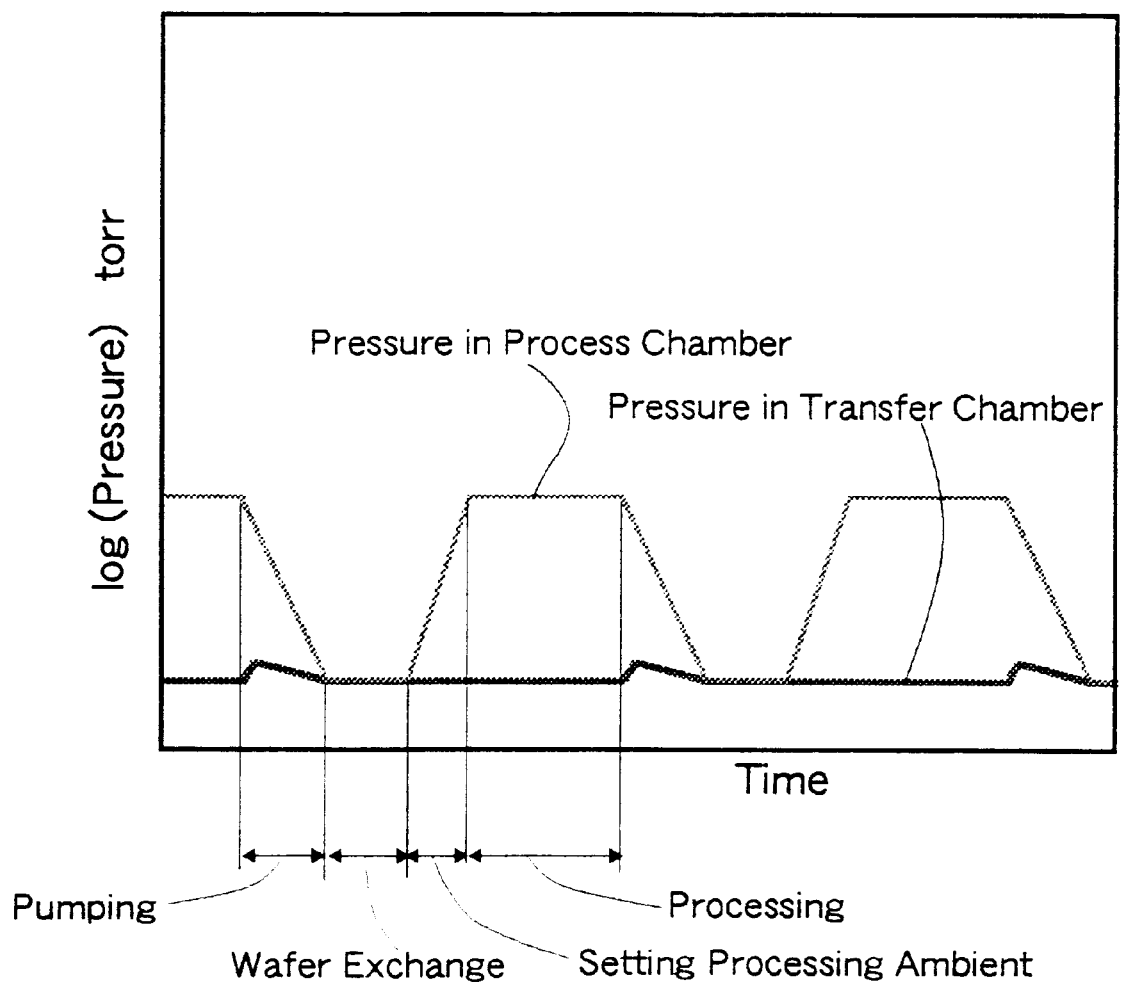
FIG. 21 is a time chart showing the pressure variation in the chambers resulting from the prior art.

FIG. 21 is a measurement result of the prior art apparatus, showing the pressure variation in the process and transfer chambers on the logarithmic scale along the time axis.

The transfer chamber has an average pressure of $10^{-5}$ torr. Before and after each processing, a substrate is carried into and out of the process chamber, which is accompanied by the evacuation and setup of ambient pressure, resulting in a huge pressure variation in the process chamber.

Comparing the measurement results of FIG. 20 and FIG. 21 reveals clearly that the treatment based on this invention expends a much shorter time for exchanging substrates in implementing the same process and attains a stable pressure with little fluctuation in the process chamber.

Figure 9A:
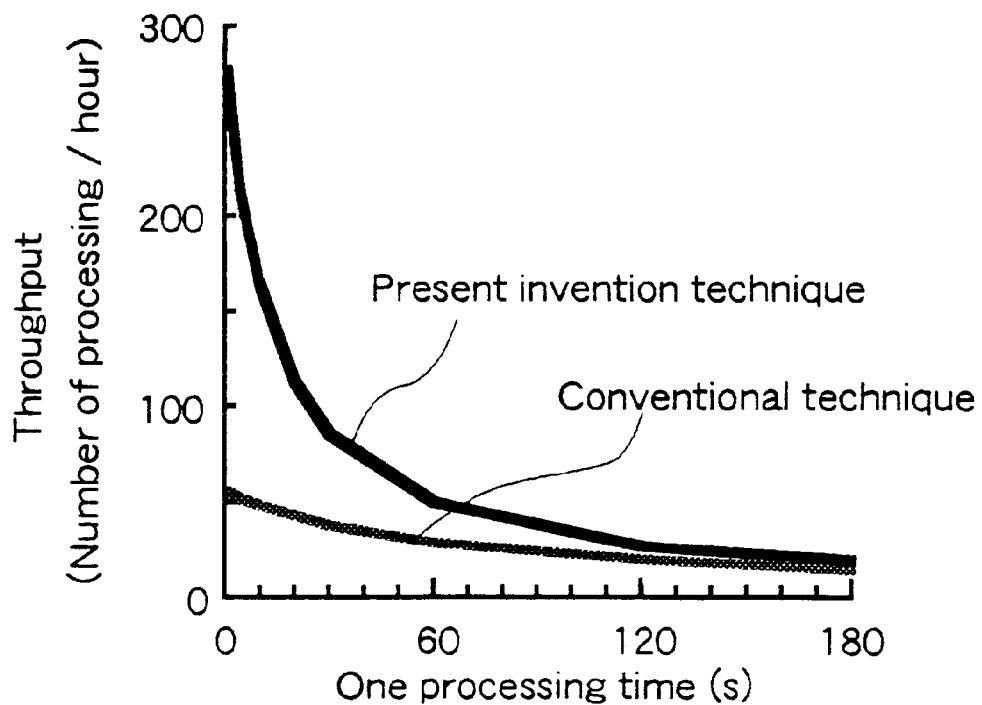
FIGS. 9A and 9B are graphs showing by comparison the throughput vs. processing time performance resulting from the inventive scheme and prior art.
Figure 9B:
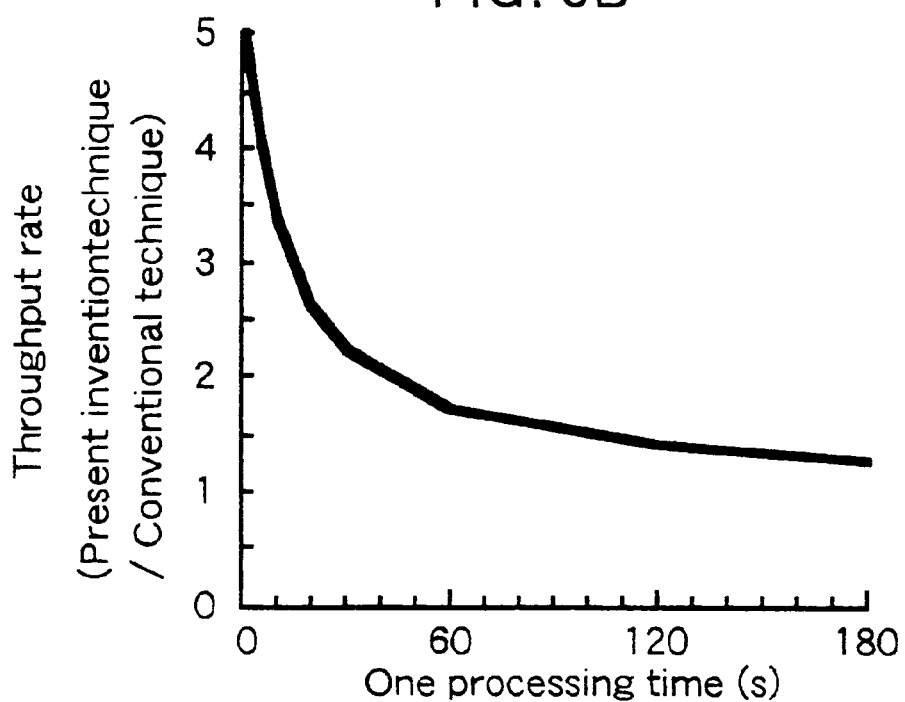

FIGS. 9A and 9B show the performance of apparatus in terms of the relation between the throughput and the processing time. FIG. 9A compares the results derived from the inventive treatment shown in FIG. 7 and the prior art treatment shown in FIG. 8. FIG. 9B plots the ratio of the throughput of inventive scheme to that of prior art. For example, at a processing time of 120 seconds, the inventive scheme performs 27 processings per unit time, which is greater by 1.4 times than 19 processings per unit time of the prior art.

At a processing time of 60 seconds, the inventive scheme performs 50 processings per unit time, which is greater by 1.7 times than 29 processings per unit time of the prior art.

At a processing time of 30 seconds, the inventive scheme performs 85 processings per unit time, which is greater by 2.2 times than 38 processings per unit time of the prior art.

Namely, the throughput is dependent on the processing time. The shorter the processing time, the greater is the improvement of throughput by the inventive scheme.

Semiconductor device fabrication apparatus are improving uninterruptedly in various ways in order to reduce the processing time. Therefore, applying the inventive scheme to the manufacturing with a reduced processing time suggests the multiplied enhancement of the throughput. In addition, the inventive scheme, which does not necessitate the restoration of ambient condition in the process chamber at each traffic of substrate, allows easy and accurate maintenance of the ambient condition, and high-quality semiconductor devices are fabricated easily by well-stabilized processings. Consequently, a semiconductor device production line which guarantees a high yield can be constructed.

Figure 10:
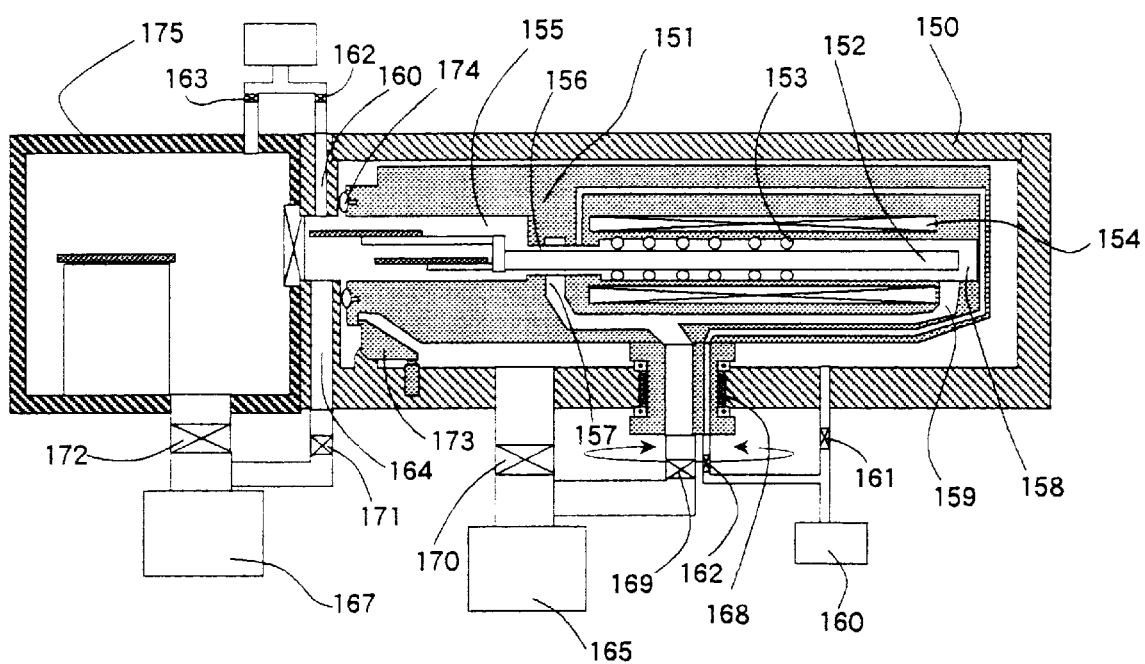
FIG. 10 is a brief cross-sectional diagram of the semiconductor device fabrication apparatus based on a third embodiment of this invention.

FIG. 10 shows in brief the cross section of a semiconductor device fabrication apparatus based on the third embodiment of this invention. It mainly consists of a transfer chamber 150, a buffer chamber 151 and a linear carriage means 152. The carriage means 152 is driven without contact by a magnetic induction means 154 by being guided by a guide bearing 153. The apparatus has its structure devised to pump out through a conductance means 156 having a narrow gap and a guide-support space 158 thereby to prevent dust particles created in the guide-support section from entering to the interior of buffer chamber 155.

The apparatus is devised to blow dust particles in the guide-support space 158 by introducing high-purity inert gas through a gas feed hole 160 and valves 161 and 162, and clean the guide-support space 158 in chemical manner by introducing prescribed cleaning gas. It is also devised to introduce inert gas to the guide-support space 158 at the same or a slightly higher pressure relative to the interior of buffer chamber 155 thereby to prevent the contamination of the guide-support space and guide-support section due to the leak of active gas which is fed to the buffer chamber.

The buffer chamber 155 can be fed with the same inert gas as of the process chamber 175 through the gas feed hole 160 located on its opening side. The buffer chamber 155 can be cleared of dust particles in physical cleaning by introducing a jet of high-purity inert gas to it through an evacuation port 164 by closing the valve 163 and opening the valve 162. It is also possible to introduce the cleaning gas through the gas feed port 160 thereby to clean the buffer chamber in chemical cleaning.

An evacuation means 165 is designed to evacuate the transfer chamber 150 and buffer chamber 155 through the gate valves 169 and 170 independently. Another evacuation means 167 is used to evacuate the buffer chamber 155 and process chamber 175 through the gate valves 171 and 172 independently. The buffer chamber 155 is rotatable, while making the transfer chamber 150 airtight from the atmosphere based on a magnetic fluid sealing means 168. The buffer chamber 155 is provided with a withstanding means 173 against the drifting force in the radial direction and the moment acting on the magnetic fluid sealing means 168 attributable to the differential pressure between it and the process chamber. The apparatus includes a flexible bellows mechanism which is operated by the pressure of fluid so that the buffer chamber communicates with the opening of process chamber through a shutoff means 174, while being airtight from the interior of transfer chamber.

Figure 11A:
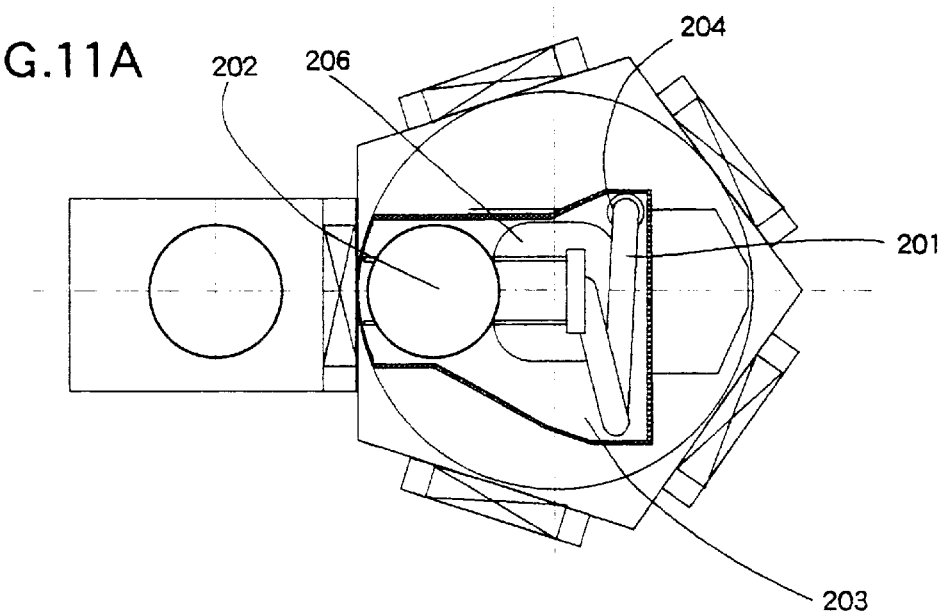
FIGS. 11A,11B and 11C are internal views of the semiconductor device fabrication apparatus using a carriage means of turning-arm type based on an embodiment of this invention.
Figure 11B:
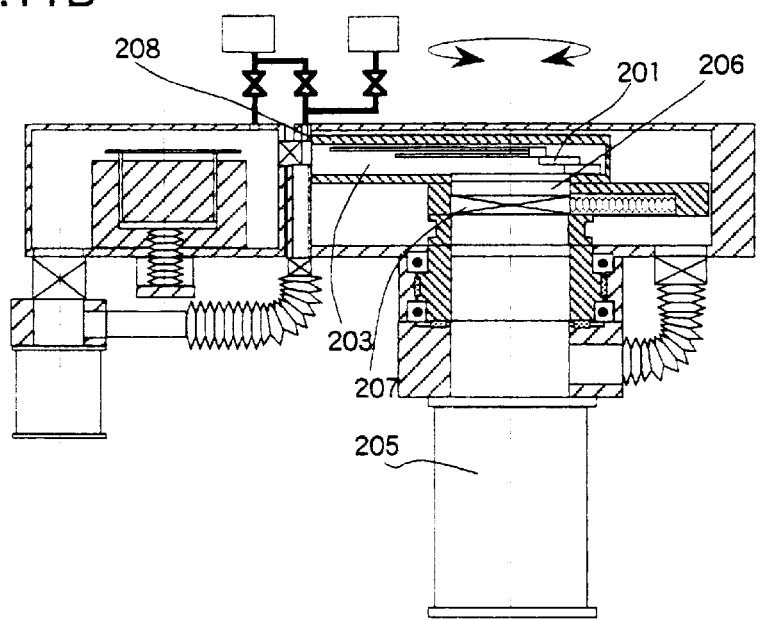
Figure 11C:
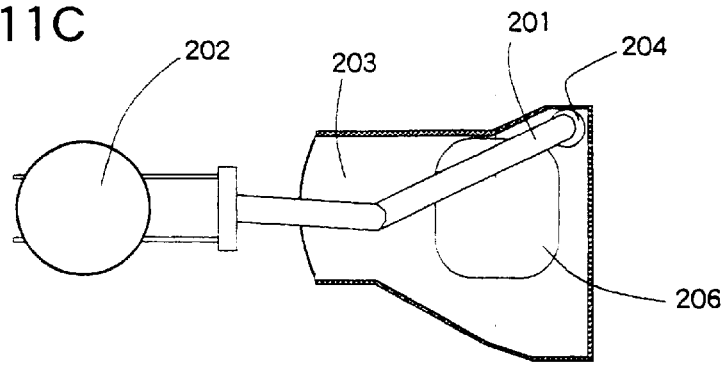

FIGS. 11A–11C show a substrate carriage means of the turning-arm type based on an embodiment of this invention. FIG. 11A is a top view of the carriage means 201 which retracts in the buffer chamber 203, FIG. 11B is a side view of the carriage means 201 in this attitude, and FIG. 11C is a top view of the carriage means 201 which stretches into the process chamber. The carriage means 201 is designed to move a substrate 202 in the radial direction based on the transmission of a drive force produced by a rotary drive means 204 through a steel belt to the driven shaft built in the arm. The buffer chamber 203 has at its turn center an opening 206 which communicates with an evacuation means 205, and has its evacuation speed adjusted by means of a conductance valve. Due to the presence of the large opening 206 at the downstream position and a gas feed port 208 at the upstream position, it is possible to prevent effectively the stagnation of contamination particles in the buffer chamber 203. Owing to the disposition of the rotary drive means 204 at the downstream position far from the opening 255 to the process chamber, where the traffic of substrate is frequent, the influence of dust particles created by the drive mechanism on the substrate can be minimized.

Figure 12A:
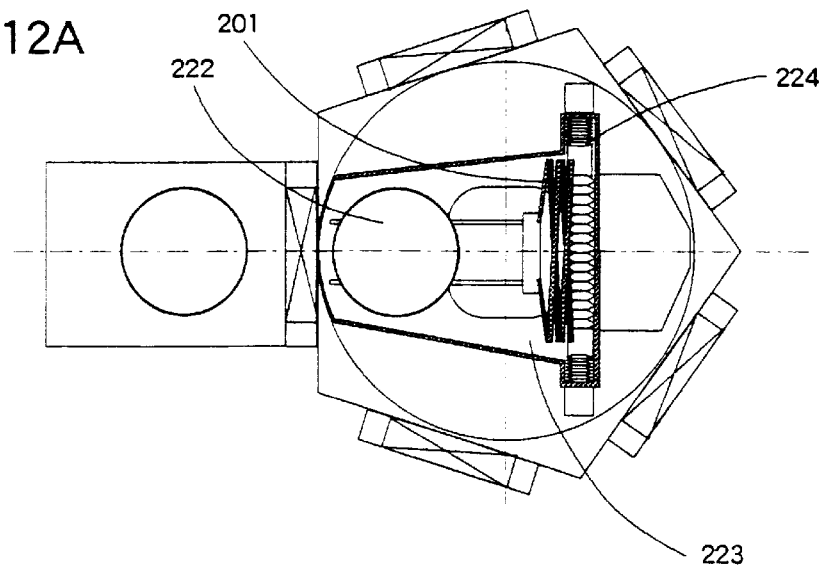
FIGS. 12A,12B and 12C are internal views of the semiconductor device fabrication apparatus using a carriage means of "multi-frog-leg" type based on an embodiment of this invention.
Figure 12B:
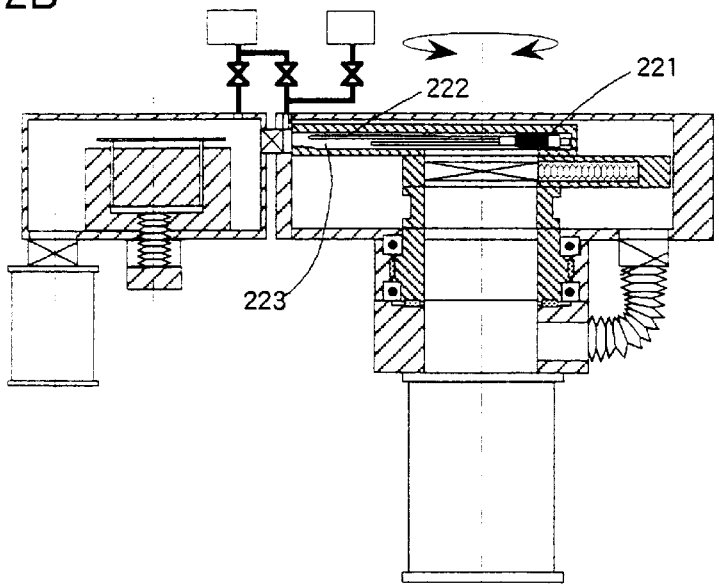
Figure 12C:
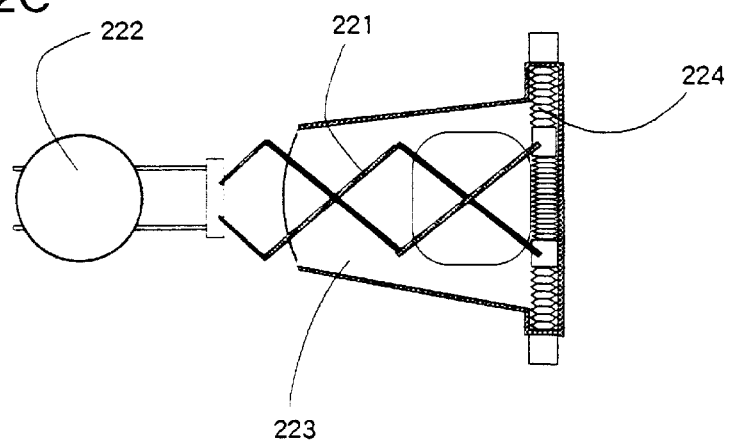

FIGS. 12A–12C show a substrate carriage means of "multi-frog-leg" type based on an embodiment of this invention. FIG. 12A is a top view of the carriage means 221 which retracts in the buffer chamber 223, FIG. 12B is a side view of the carriage means 221 in this attitude, and FIG. 12C is a top view of the carriage means 221 which stretches into the process chamber. The carriage means 221 is designed to move a substrate 222 in the radial direction by being guided by a linear guide means based on the transmission of drive forces in opposite directions produced by a pair of linear drive means 224 to the multi-stage frog-leg arm.

Figure 13A:
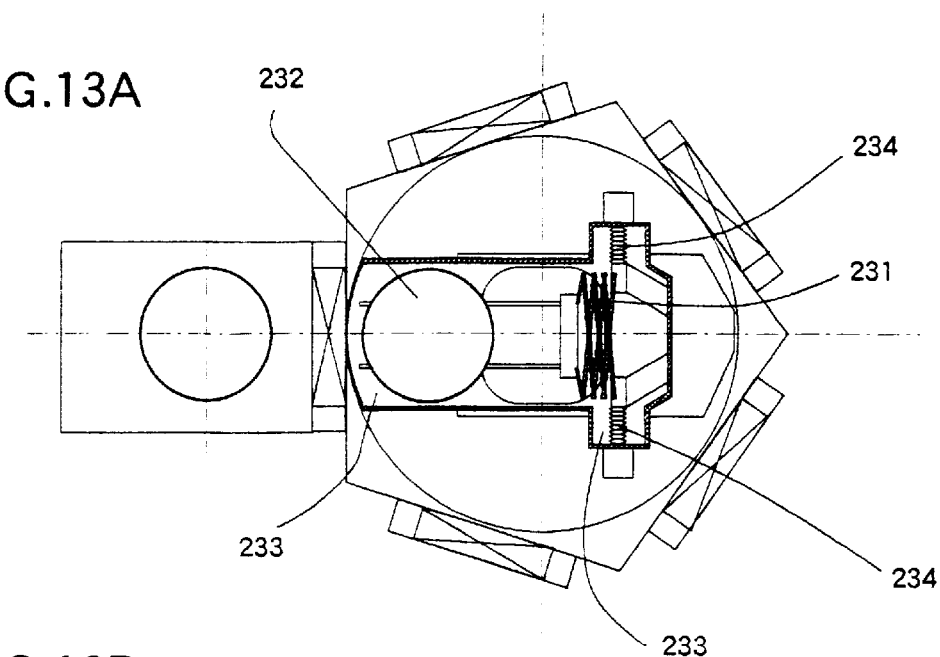
FIGS. 13A,13B and 13C are internal views of the semiconductor device fabrication apparatus using a carriage means of "multi-frog-leg" type based on another embodiment of this invention.
Figure 13B:
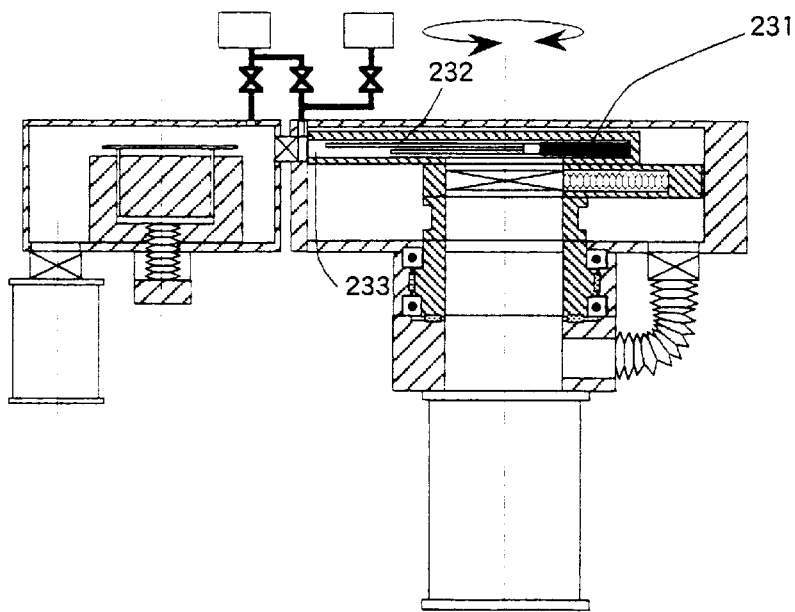
Figure 13C:
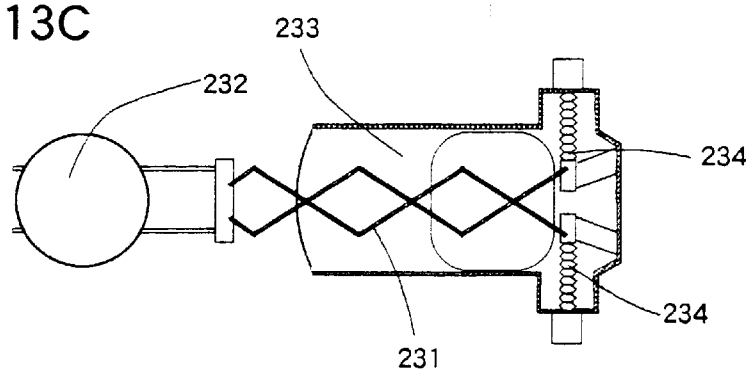

FIGS. 13A–13C show a substrate carriage means of "multi-frog-leg" type based on another embodiment of this invention. FIG. 13A is a top view of the carriage means 231 which retracts in the buffer chamber 233, FIG. 13B is a side view of the carriage means 231 in this attitude, and FIG. 13C is a top view of the carriage means 231 which stretches into the process chamber. The carriage means 231 is designed to move a substrate 232 in the radial direction by being guided by a parallel motion guide of a parallel flat spring based on the transmission of drive forces in opposite directions produced by a pair of linear drive means 234 to the multi-stage frog-leg arm.

Another conceivable design of substrate carriage means is the combination of a multi-frog-leg mechanism having expandable stroke and a linear guide having high mechanical stiffness.

Figure 14A:
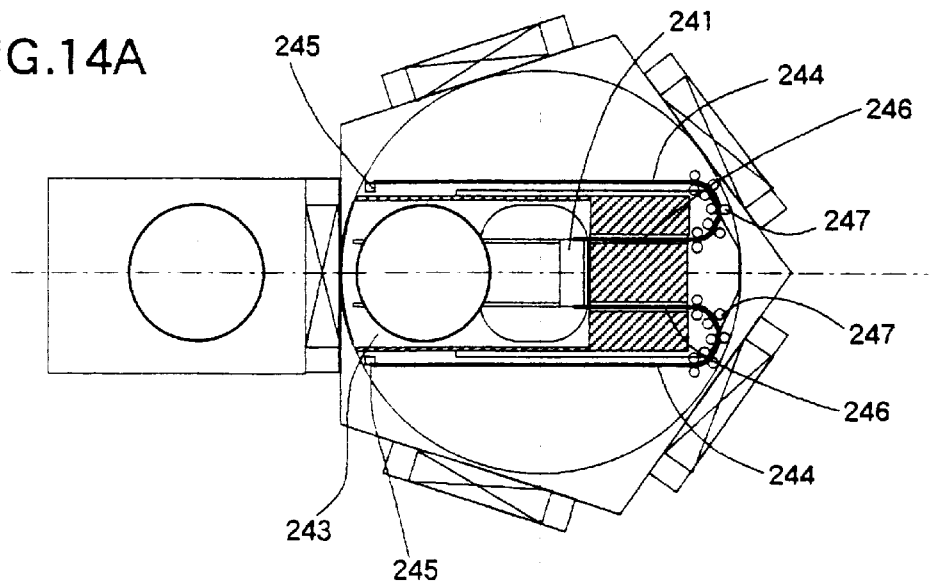
FIGS. 14A,14B and 14C are internal views of the semiconductor device fabrication apparatus using a carriage means of steel-belt type based on an embodiment of this invention.
Figure 14B:
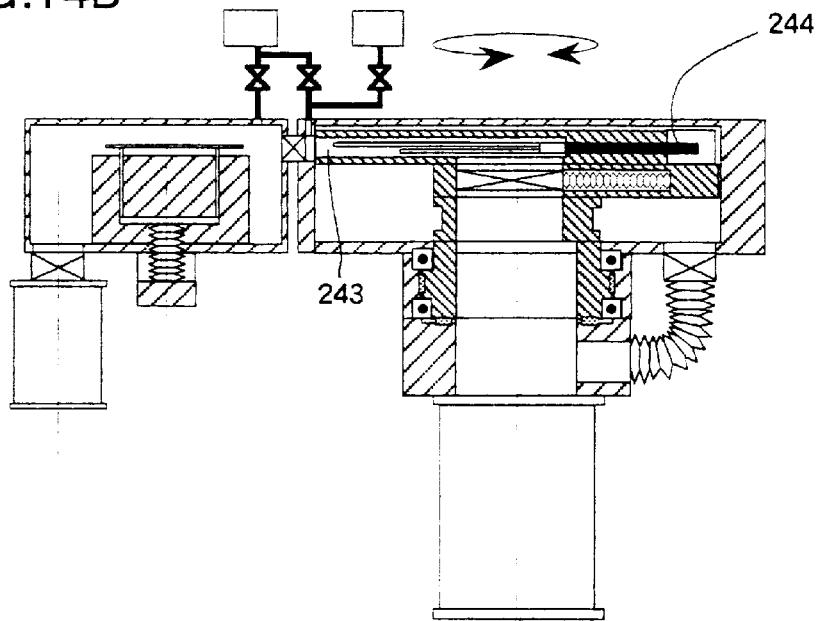
Figure 14C:
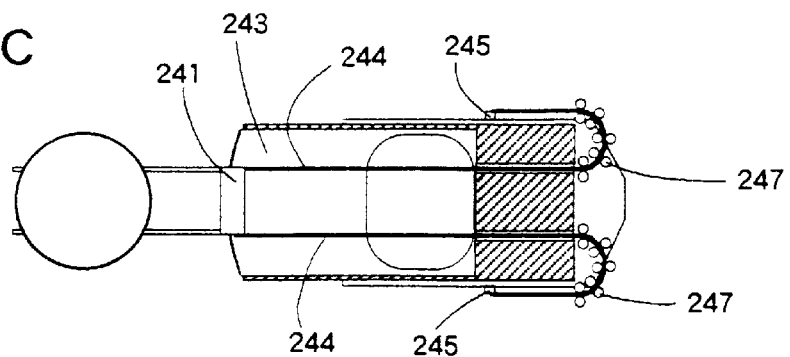

FIGS. 14A–14C show a substrate carriage means of steel belt type based on an embodiment of this invention. FIG. 14A is a top view of the carriage means 241 which retracts in the buffer chamber 243, FIG. 14B is a side view of the carriage means 241 in this attitude, and FIG. 14C is a plan view of the carriage means 241 which stretches into the process chamber. The carriage means 241 is designed to move a substrate 242 in the radial direction by being driven by a pair of steel belts 244 which run through conductance clearances 246 by being driven by a pair of drive means 247 fitted on the buffer chamber outer wall and guided by guide means 247.

The carriage means of FIGS. 14A–14C is simple and does not have abrasive parts, such as rotary bearings, which create dust particles inside the buffer chamber 243, and it is highly durable even in the environment of active gas. The flexible steel belts 244 which run horizontally can be routed along arbitrary curves based on the guide means 247, and it enables the expansion of stroke of the carriage means and also allows the design of a compact transfer chamber and buffer chamber.

Figure 15A:
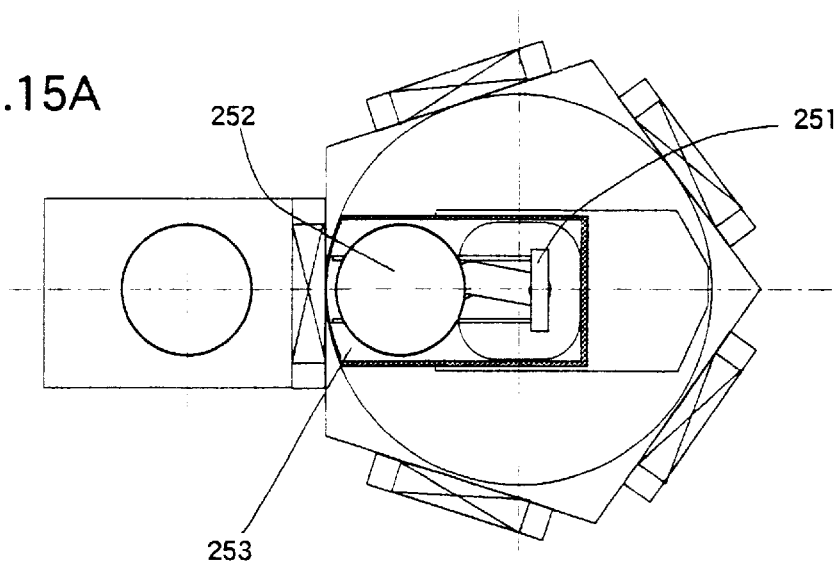
FIGS. 15A,15B and 15C are internal views of the semiconductor device fabrication apparatus using a carriage means of small turning-arm type based on an embodiment of this invention.
Figure 15B:
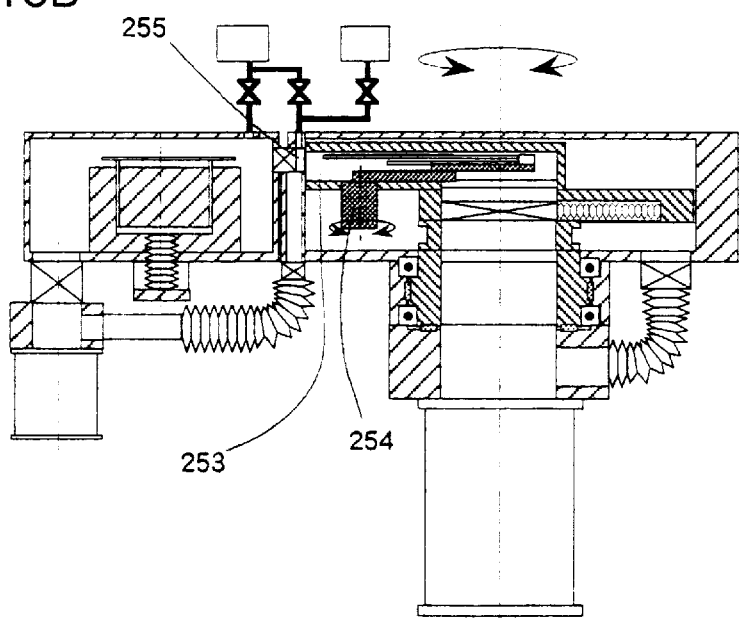
Figure 15C:
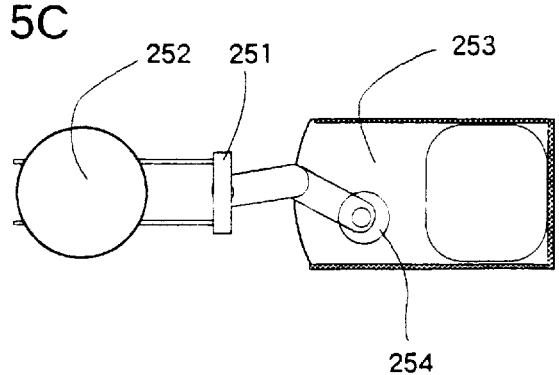

FIGS. 15A–15C show a substrate carriage means of small-turning-arm type based on an embodiment of this invention. FIG. 15A is a top view of the carriage means 251 which retracts in the buffer chamber 253, FIG. 15B is a side view of the carriage means 251 in this attitude, and FIG. 15C is a top view of the carriage means 251 which stretches into the process chamber. The carriage means 251 is designed to move a substrate 252 in the radial direction based on the transmission of a drive force produced by a rotary drive means 254 through a steel belt to the driven shaft built in the arm. This carriage mechanism has its rotary drive means 254 disposed at a position of buffer chamber nearer to the opening to the process chamber, as compared with the embodiment shown in FIGS. 11A–11C, so that the length of arm is reduced.

It should be noted that the foregoing embodiments of FIGS. 11A–11C through FIGS. 15A–15C can have smaller buffer chambers in the descending order of the drawings.

Figure 16:
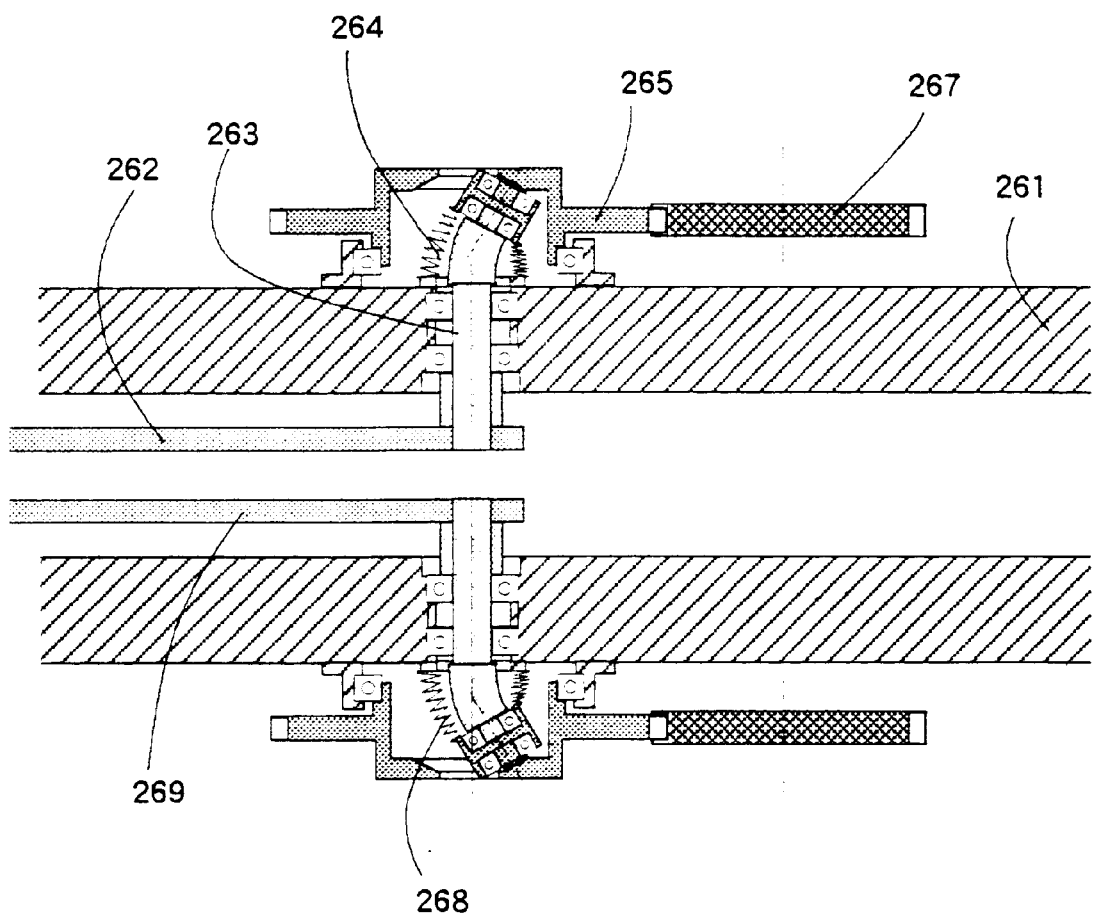
FIG. 16 is a enlarged cross-sectional diagram showing the details of the crank drive means based on an embodiment of this invention.

FIG. 16 shows the details of the rotary drive means based on an embodiment of this invention. It has a swing shaft 263, which is fixed to the arm 262 of a substrate carriage means, such as those shown in FIGS. 4A–4C, FIGS. 11A–11C and FIGS. 15A–15C, and connected to a rotary manipulator 264 located in the transfer chamber and supported by a guide/support means which is fitted in a through hole formed in the wall of the buffer chamber 261. The rotary manipulator 264 seals the buffer chamber by means of bellows against the interior of transfer chamber, and has its drive torque transmitted from the gear 267 on the driver to the gear 265 on the rotary manipulator 264, thereby swinging the arm 262.

In the previous embodiments, in which the carriage means is used to take up a processed substrate and place an unprocessed substrate as shown in FIGS. 6A–6F, it is enough to equip one set of rotary carriage means on the cealing or floor of the buffer chamber. In another case of using two sets of carriage means in the buffer chamber for handling a processed substrate and an unprocessed substrate independently, the upper and lower rotary manipulators 264 and 268 are fitted on the respective arms 262 and 269 as shown in FIG. 16. In both cases, it is possible to seal off the buffer chamber from the transfer chamber completely in a simple structure.

Figure 17:
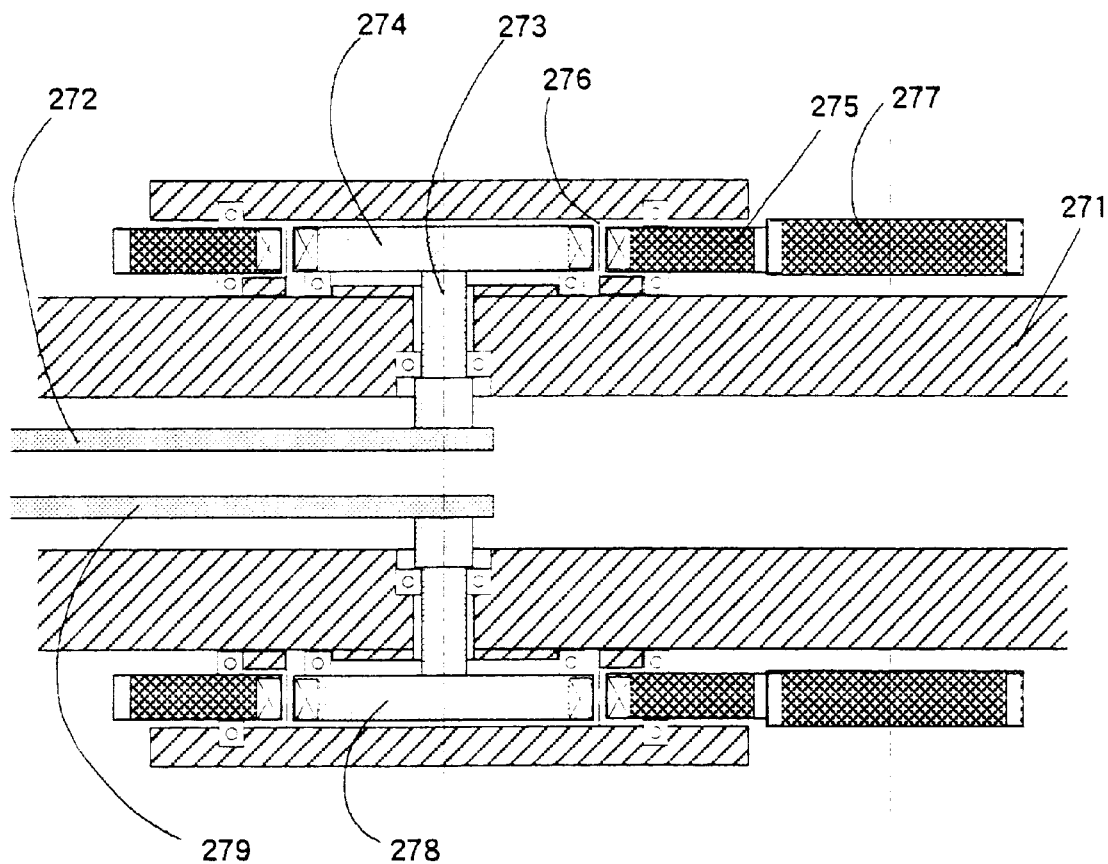
FIG. 17 is a enlarged cross-sectional diagram showing the details of the crank drive means based on another embodiment of this invention.

FIG. 17 shows the details of the rotary drive means based on another embodiment of this invention. It has a swing shaft 273, which is fixed to the arm 272 of a substrate carriage means, such as those shown in FIGS. 4A–4C, FIGS. 11A–11C and FIGS. 15A–15C, and connected to a magnetic coupling mechanism 274 located in the transfer chamber and supported by a guide/support means which is fitted in a through hole formed in the wall of the buffer chamber 271. The magnetic coupling mechanism 274 engages by its magnetic force with a gear 275 located in the transfer chamber through a thin cylindrical wall 276, thereby sealing off the buffer chamber from the transfer chamber. The drive torque is transmitted from the gear 277 on the driver to the gear 275 and to the magnetic coupling mechanism 274 so that the arm 272 is swung.

The arrangement shown in FIG. 17 has the upper and lower magnetic coupling mechanisms 274 and 278 fitted on the respective arms 272 and 279, as in the case of the previous embodiment of FIG. 16. It is possible to seal off the buffer chamber from the transfer chamber completely in a simple structure.

By utilizing the conductance reduction effect derived from the small gap thereby to fit the shaft to run through from the buffer chamber to the transfer chamber so that it links to the driver without backlash, a rotary drive means can have have the enhanced rigidity to suit for driving a long arm.

The carriage means shown in FIGS. 6A–6F, which holds two pieces of substrates on two forks that are displaced from each other by distance r, is adaptive to a simple wafer stage means which moves only vertically in the process chamber.

FIGS. 18A–18F show in brief the cross section of the wafer stage means based on an embodiment of this invention. In each figure, shown on the left-hand side is a view seen from the process chamber, and shown on the right-hand side is a view seen from the side of the substrate traffic path.

Figure 18A:
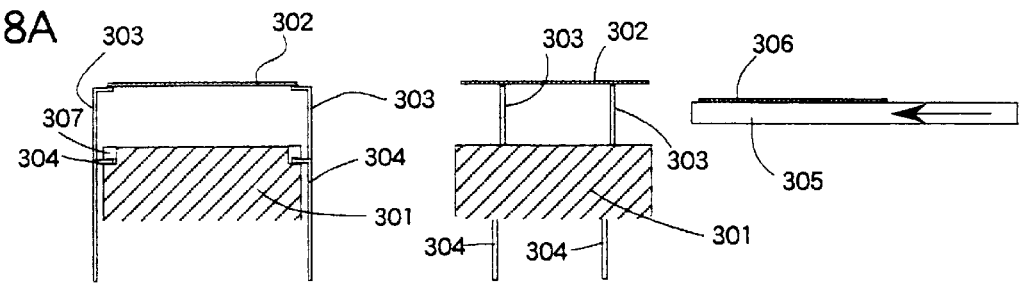
FIGS. 18A through 18F are cross-sectional diagrams of the wafer stage means based on an embodiment of this invention.

A shunt suscepter 303 having L-shaped tips is raised to take up a processed substrate 302 above a wafer stage 301, and a carriage means 305 holding an unprocessed substrate 306 is moved into the process chamber such that it does not touch the substrate 302, as shown in FIG. 18A.

Figure 18B:
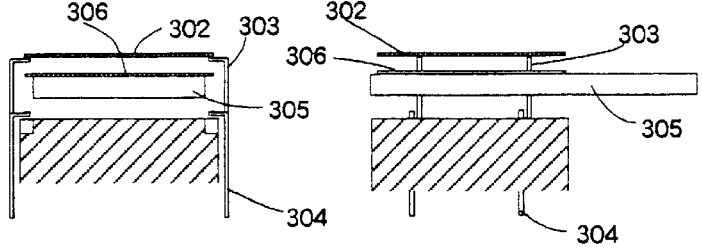

A transfer suscepter 304 having L-shaped tips is raised to receive the unprocessed substrate 306 which has been carried to the position above the wafer stage, as shown in FIG. 18B.

Figure 18C:
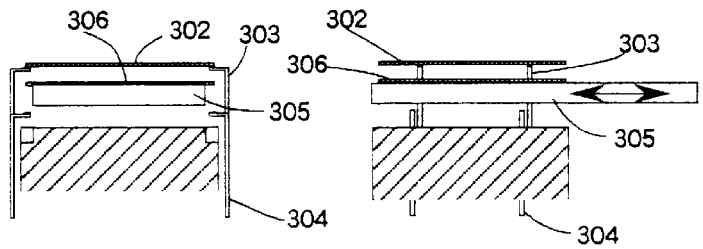

The transfer suscepter 304 is raised to push up the unprocessed substrate 306 at its rim section overhanging the carriage means so that it comes off the carriage means, and the carriage means 305 is drawn toward the buffer chamber as shown by the arrow by a distance greater than the diameter of substrate. The transfer suscepter 304 is lowered to place the unprocessed substrate 306 on the wafer stage 301, as shown in FIG. 18C.

Figure 18D:
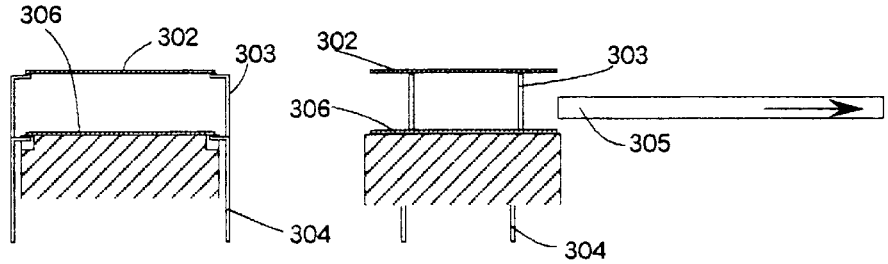

The carriage means 305 is moved into the process chamber again, and the shunt suscepter 303 is lowered to place the processed substrate 302 on the carriage means 305, as shown in FIG. 18D.

Figure 18E:
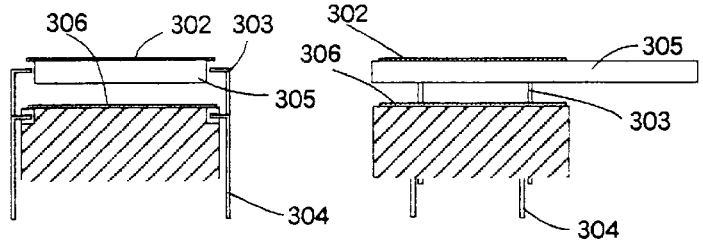
Figure 18F:
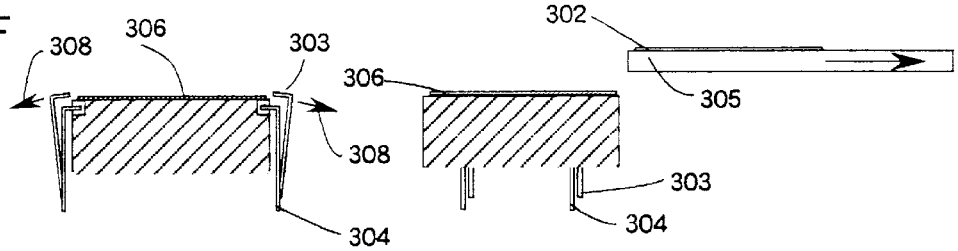
Figure 19A:
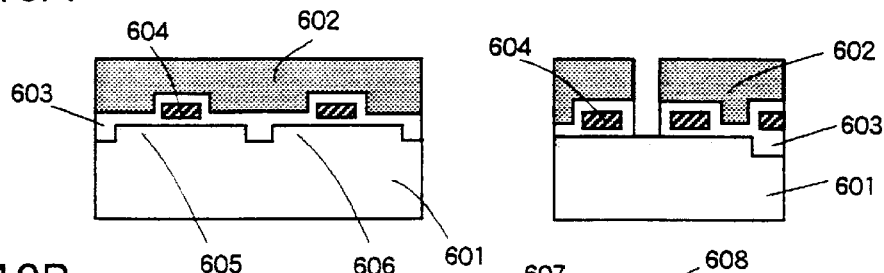
FIGS. 19A through 19G are cross-sectional diagrams showing the method of semiconductor device fabrication based on an embodiment of this invention.
Figure 19B:
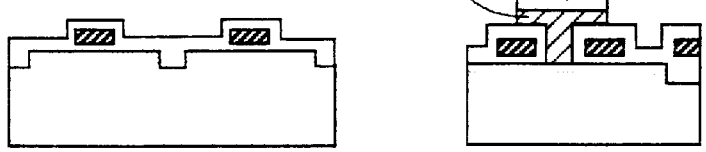
Figure 19C:
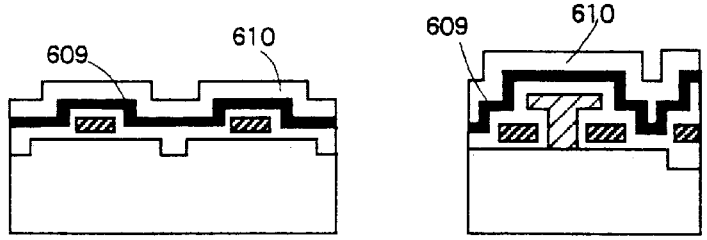
Figure 19D:
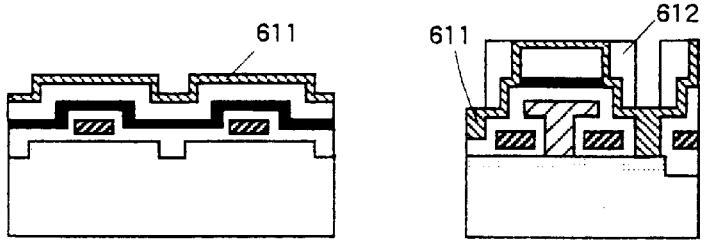
Figure 19E:
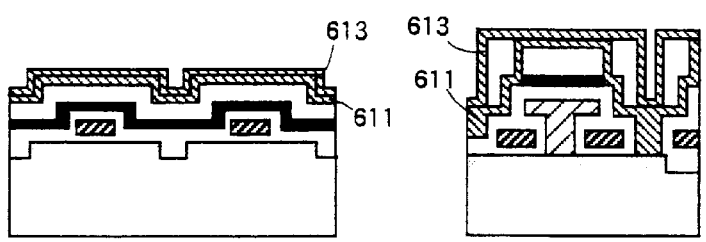
Figure 19F:
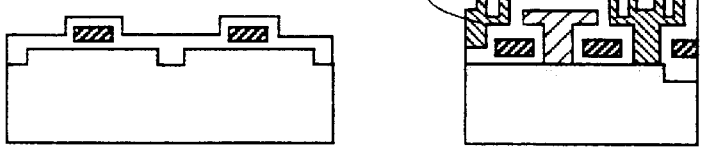
Figure 19G:
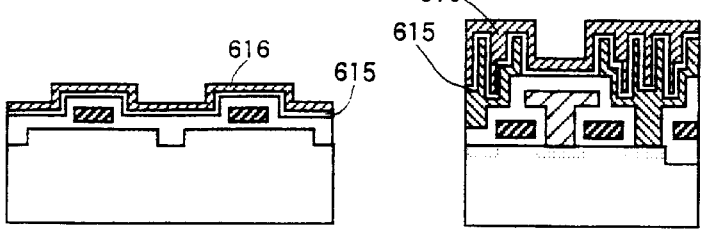

The carriage means 305 holding the processed substrate 302 is retracted in the buffer chamber as shown by the arrow. The shunt suscepter 303 is further lowered, while being inclined as shown by the arrow 308 so that it is clear of the unprocessed substrate 306 on the wafer stage, and it is shut up in a shunt groove 307, as shown in FIG. 18E.

Besides the above-mentioned mechanism for shutting up the shunt suscepter 303 in the wafer stage, other conceivable manners include the rotation of the shunt suscepter about the vertical axis of the substrate, the retraction of the L-shaped tips, and the bending at the joint of the shunt suscepter. In any case, this carriage means can have a simple structure owing to carrying only one piece of substrate.

Next, a method of fabricating a semiconductor device based on an embodiment of this invention will be explained by making reference to the process of the stacked-type DRAM (dynamic random access memory) described in the article entitled "Innovative Semiconductor Processing Technology in 1994" in the supplement of monthly publication "Semiconductor World", pp. 23–31.

FIGS. 19A–19G are cross-sectional diagrams of a semiconductor device used to explain the inventive fabrication method. Generally, a semiconductor device such as a DRAM is fabricated by repeating the processing steps of forming wafer stages, wells, isolation layers, transistors, bit lines, capacitors and wirings. Technologies of processing employed in combination include the lithography, etching, heat treatment (oxidation, annealing, diffusion), ion implantation, thin-film formation (CVD, sputtering, evaporation), cleaning (resist removal, rinsing with solution), and quality verification.

Shown in FIGS. 19A–19G is the sequential process of forming bit lines and capacitors of a DRAM, and particularly the processing steps which cause the cross-sectional device structure to vary. In each figure, shown on the left-hand side is the cross section of memory cells, and shown on the right-hand side is the cross section of the peripheral CMOS circuits.

The process consists of 25 major processing steps, which are step 1 of $SiO_2$ deposition, step 2 of lithography, step 3 of etching (FIG. 19A), step 4 of $SiO_2$ deposition, step 5 of polycide deposition, step 6 of lithography for bit lines, step 7 of etching (FIG. 19B), step 8 of $SiO_2$ deposition, step 9 of $Si_3N_4$ deposition, step 10 of $SiO_2$ deposition (FIG. 19C), step 11 of lithography, step 12 of etching, step 13 of poly-Si storage electrode formation, step 14 of $SiO_2$ deposition, step 15 of etching (FIG. 19D), step 16 of poly-Si storage electrode formation (FIG. 19E), step 17 of $SiO_2$ deposition, step 18 of etching, step 19 of poly-Si etching, step 20 of $SiO_2$ etching, step 21 of $Si_3N_4$ etching, step 22 of $Ta_2O_5$ insulating film formation for capacitors, step 23 of W(poly-Si) film formation (FIG. 19G), step 24 of lithography for plate formation, and step 25 of etching.

Materials used in the semiconductor structure shown in FIGS. 19A–19G are substrate 601, resist 602, $SiO_2$ passivation film 603, $Si_3N_4$ 604, $n^+$ layer 605, $p^+$ layer 606, poly-Si (polycide) 607, $SiO_2$ 608, $Si_3N_4$ 609, $SiO_2$ 610, poly-Si 611, $SiO_2$ 612, poly-Si 613 and 614, $Ta_2O_5$ 615, and W(poly-Si) 616.

Among the 25 processing steps, the inventive semiconductor device fabrication apparatus is capable of carrying out the steps 3–5, steps 7–10, and steps 13–23 for the $SiO_2$ deposition, poly-Si deposition, $Si_3N_4$ deposition, poly-Si etching, $SiO_2$ etching, $Si_3N_4$ etching, $Ta_2O_5$ layer formation, and W layer formation, without exposing the substrate to the atmosphere. Consequently, the inventive semiconductor device fabrication apparatus eliminates natural oxidized films and contamination to provide a clean semiconductor surface based on the surface control for ensuring the high repeatability of processing, and enables easy production of high-quality semiconductor devices at high throughput.

Figure 22:
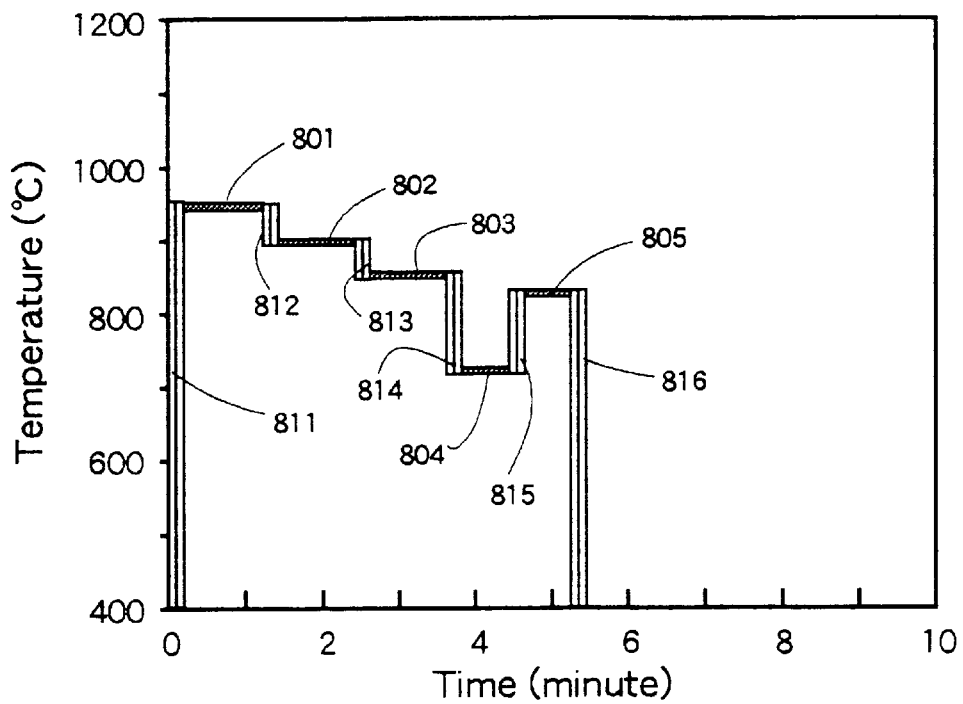
FIG. 22 is a time chart of high-temperature treatment based on the inventive scheme.

FIG. 22 shows the time chart of heat treatment based on an embodiment of this invention for forming a thin silicon nitride film having a high oxidation resistance by getting rid of the influence of a natural oxide film.

The heat treatment implemented in separate process chambers includes a $H_2$ process 801 at a temperature of 950° C. and at an ambient pressure of 50 torr, a thermal nitriding process 802 at 900° C. and 10 torr, a $SiH_4/NH_3$ process 803 at 850° C. and 1.5 torr, a $SiH_4$ process 804 720° C. and 5 torr, and $SiH_4$ process 805 at 830° C. and 2 torr, with a substrate being carried in and out at steps 811,812,813,814,815 and 816, taking a total processing time of 5 minutes 30 seconds.

Figure 23:
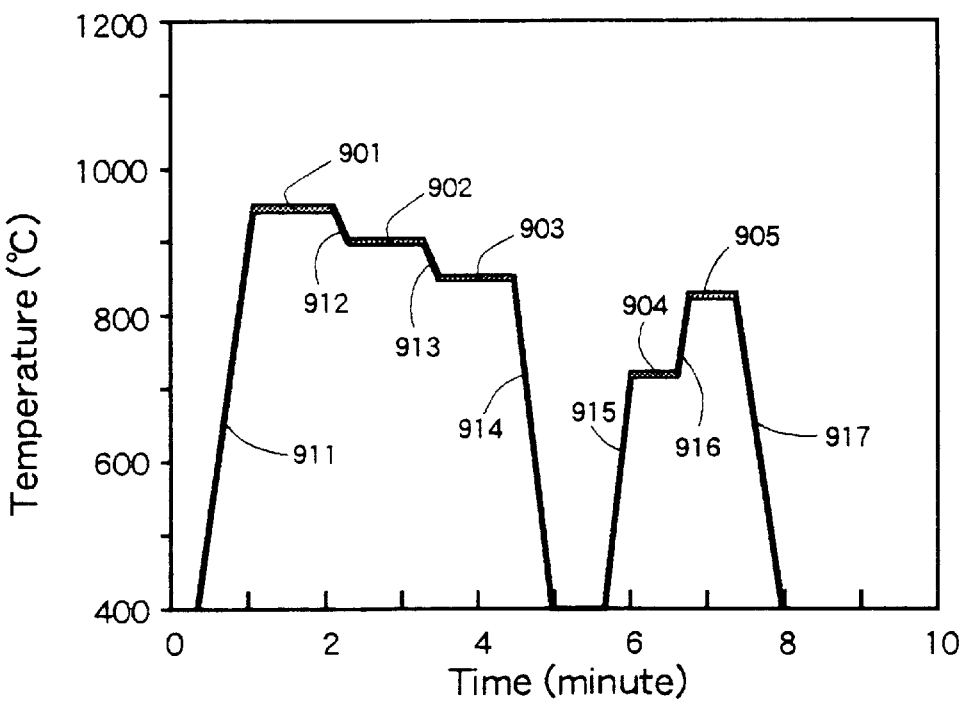
FIG. 23 is a time chart of high-temperature treatment based on the prior art.

FIG. 23 shows the time chart of processing based on the prior art for the same heat treatment as shown in FIG. 22. The heat treatment implemented in two process chambers includes a $H_2$ process 901 at a temperature of 950° C. and at an ambient pressure of 50 torr, a thermal nitriding process 902 at 900° C. and 10 torr, a $SiH_4NH_3$ process 903 at 850° C. and 1.5 torr, a $SiH_4$ process 904 at 720° C. and 5 torr, and $SiH_4$ process 905 at 830° C. and 2 torr. The processes 901,902 and 903 are implemented in one process chamber, and the processes 904 and 905 are implemented another process chamber. It necessitates the repetitive ambient condition setup steps 912,913 and 916 for the process chambers, and further necessitates lengthy ambient condition setup steps 911,914, 915 and 917 for carrying the substrate to/from separate process chambers, taking a total processing time of 8 minutes 20 seconds.

Comparing the heat treatments of FIG. 22 and FIG. 23 reveals that the inventive scheme reduces significantly the time of processings that are carried out successively in different ambient conditions.

Besides the above process, it was confirmed that the present invention is capable of fabricating high-quality semiconductor devices at high throughput as a result of application to the selective W-film formation and formation of Al and cu films with low-resistance contact which necessitate the surface control for removing natural oxidize films, moisture and contamination to provide a clean surface and utilize the chemical difference of the surface.

Moreover, the inventive semiconductor device fabrication apparatus having process chambers for dealing with poly-Si, oxidize film, Al, W, trench, multi-layer resist, resist ashing, etc. is capable of readily performing polycide etching and oxide-film etching continuously, whereby it is possible to produce high-quality flash memories at high throughput.

The present invention is not confined to the fabrication of semiconductor devices, but is applicable to the production line of liquid crystal panels using thin-film transistors (TFTs).

The inventive semiconductor device fabrication apparatus with a plasma CVD process chamber having a setup of a prescribed ambient condition including the heating temperature (up to 400° C.), gas feed, and discharge condition, with a liquid crystal substrate from the load-lock chamber being carried in for plasma cleaning, and process chambers for the formation of films of silicon nitride, amorphous silicon, doped amorphous silicon, silicon dioxide, oxide nitride, etc., is capable of readily providing the fabrication environment which is rid of natural oxidize films, moisture and contamination, whereby it is possible to produce high-quality liquid crystal panels at high throughput.

The inventive scheme, in which substrates are carried for processing into various process chambers where the ambient conditions are retained, allows the management and recording of the states of substrates and process chambers by transferring the measurement and test results of substrates during and after processings to the central control system, whereby a reliable semiconductor device fabrication system with the ability of diagnosis and maintenance of the process chambers and whole facility can be constructed.

The inventive method and apparatus is designed to carry a substrate by equalizing the ambient condition in the buffer chamber to the condition in the process chamber, and accordingly it is possible to implement the process at the level of atomic layer on the substrate surface and carry the substrate from one processing chamber to the next chamber without causing molecules and atoms to come off the substrate surface. In contrast, it is necessary for the prior art apparatus to evacuate the chambers to the vacuum state at each traffic of substrate, causing atoms in very small quantity to come off the substrate surface, and it is difficult to fabricate new functions stably. Namely, the present invention makes it possible at the first time to solve the prior art problem.

In case the buffer chamber filled with ambient gas different from that of the transfer chamber is turned within the transfer chamber, it is readily possible for the present invention to design the sealing mechanism shown in FIG. 5 to have a clearance as small as several micrometers or less thereby to keep the internal pressure of the buffer chamber higher by several tens torr than the transfer chamber based on the reduced conductance, or have a simple shut valve on the opening side of the buffer chamber.

In the etching process using chlorine or bromine gas, the processing gas is liable to adhere to the substrate surface, and this gas component can cause the cross-contamination if the substrate is simply carried to the next process chamber. In order to prevent the cross-contamination, the inventive method and apparatus is readily capable of bringing the buffer chamber to a super-high vacuum state thereby to remove the adhering gas, introducing neutralization gas to the buffer chamber thereby to make the unwanted gas component inactive, implementing the gas cleaning-removal in the buffer chamber, or implementing the plasma ashing-removal in the buffer chamber. The inventive method and apparatus is capable of implementing the removal of cross-contamination in the buffer chamber in a short time during the substrate conveyance.

These advantages of the present invention are based on the small movable buffer chamber having its ambient condition controlled independently.

In the case of repetitive processings for forming intricate high-quality thin films and the like under ambient conditions of large temperature differences, it is difficult for the prior art apparatus to render a quick temperature variation to the substrate due to a large thermal capacity of the wafer stage and the evacuation and setup of pressure of the process chamber. The inventive method and apparatus, in which a substrate is taken out of a process chamber and carried into the buffer chamber while retaining the ambient condition in the process chamber and then carried in a short time into another process chamber having a setup of different ambient condition, make it possible at the first time to render high-performance semiconductor functions to substrates easily at high repeatability based on the surface control of enhanced accuracy.

It will be appreciated that the present invention is also applicable to the multi-process apparatus for manufacturing innovative engineering materials having intended characteristics under special environments based on the surface control of metal and resin thereby to suppress the fluctuation.

As described above, the inventive method and apparatus is capable of performing the wafer-handling interface under processing ambient conditions (WHIPAC).

The substrate is carried into/out of a process chamber by being enclosed in the movable buffer chamber which is consistent in ambient condition with the process chamber.

Multiple process chambers share the buffer chamber for carry-in and carry-out of substrates. Consequently, it becomes possible to implement the surface control of substrate at the atomic level easily and accurately in a short time and, as a result, it becomes possible to produce high-quality semiconductor devices at high throughput.

What is claimed is:

1. A semiconductor device fabrication method including the conveyance of a substrate from a transfer chamber to a process chamber, which abut on each other and have different ambient conditions, said method comprising at least the steps of:

carrying the substrate into and out of said process chamber, while retaining the ambient condition in said process chamber; and implementing a process for the substrate in said process chamber.

2. A semiconductor device fabrication method according to claim 1, wherein said processing step includes the steps of:
commencing the process in the ambient condition of the time when the substrate has been carried into said process chamber; and
implementing the process by controlling the ambient condition to vary to different conditions as the process goes on.

3. A semiconductor device fabrication method according to claim 2, wherein said processing step includes the step of implementing the process by controlling the ambient pressure as an ambient condition to vary to different conditions.

4. A semiconductor device fabrication method according to claim 2, wherein said processing step includes the step of implementing the process by controlling the temperature of substrate as an ambient condition to vary to different conditions.

5. A semiconductor device fabrication method according to claim 2, wherein said processing step includes the step of implementing the process by controlling the ambient gas component as an ambient condition to vary to different conditions.

6. A semiconductor device fabrication method according to claim 2, wherein said processing step includes the step of implementing the process by controlling the radiation of beam energy as an ambient condition.

7. A semiconductor device fabrication method according to claim 1 further including the step of equalizing the ambient condition in a buffer chamber to the ambient condition in a process chamber which said buffer chamber faces.

8. A semiconductor device fabrication method according to claim 1 further including the step of equalizing the ambient condition in a movable buffer chamber to the ambient condition in a process chamber which said buffer chamber faces.

9. A semiconductor device fabrication method according to claim 1 further including the step of equalizing the ambient condition in a buffer chamber to the ambient condition in a process chamber to which said buffer chamber moves to face.

10. A semiconductor device fabrication method according to claim 1 further including the step of equalizing the ambient condition in a buffer chamber to the ambient condition in a process chamber which said buffer chamber faces, said buffer chamber being smaller in capacity than said process chamber.

11. A semiconductor device fabrication method according to claim 1 further including the step of equalizing the ambient condition in a buffer chamber to the ambient condition in a process chamber which said buffer chamber faces, said buffer chamber having substrate carriage means.

12. A semiconductor device fabrication method according to claim 11 including the step of equalizing the ambient condition in said buffer chamber to the ambient condition in a process chamber which said buffer chamber faces, said buffer chamber having carriage means which can carry at least two pieces of substrates.

13. A semiconductor device fabrication method according to claim 1 further including the step of taking out a substrate from the process chamber temporarily and carrying a substrate out of a buffer chamber and placing the substrate from said buffer chamber in said process chamber.

14. A semiconductor device fabrication method according to claim 1 further including the step of carrying substrates by enclosing the substrates in a plurality of movable buffer chambers having same ambient conditions as of process chambers which said buffer chambers will face next.

15. A semiconductor device fabrication method according to claim 1 further including the step of carrying substrates in a plurality of buffer chambers which can set up same ambient conditions as of process chambers which said buffer chambers will face next.

16. A semiconductor device fabrication method according to claim 15 including the step of carrying substrates in a plurality of buffer chambers which can set up ambient conditions for heating.

17. A semiconductor device fabrication method according to claim 15 including the step of carrying substrates in a plurality of buffer chambers which can set up ambient conditions for cooling.

18. A semiconductor device fabrication method according to claim 15 including the step of carrying substrates in a plurality of buffer chambers which can set up ambient conditions for cleaning.

19. A semiconductor device fabrication method according to claim 15 including the step of carrying substrates in a plurality of buffer chambers which can set up ambient conditions for ashing.

20. A semiconductor device fabrication method according to claim 15 including the step of carrying substrates in a plurality of buffer chambers which can set up ambient conditions for degassing.

21. A semiconductor device fabrication method according to claim 15 including the step of carrying substrates in a plurality of buffer chambers which can set up ambient conditions for suppressing the degassing.

22. A semiconductor device fabrication method according to claim 1 further including the step of equalizing the ambient condition in a buffer chamber to the ambient condition in a process chamber which said buffer chamber faces, said buffer chamber having substrate carriage means which can carry a substrate in vertical attitude thereof.

23. A semiconductor device fabrication method according to claim 1 further including the step of equalizing the ambient condition in a buffer chamber to the ambient condition in a process chamber which said buffer chamber faces, said buffer chamber having substrate carriage means which can carry a substrate in inverted attitude thereof.

24. A semiconductor device fabrication method including the conveyance of a substrate from a transfer chamber to a process chamber, which abut on each other and have different ambient conditions, said method comprising at least the steps of:
carrying the substrate into and out of said process chamber by equalizing the ambient condition in a movable buffer chamber, which encloses the substrate, to the ambient condition in said process chamber; and
implementing a process for the substrate in said process chamber.

25. A semiconductor device fabrication method including the conveyance of a substrate from a transfer chamber to a plurality of process chambers, which abut on each other and have different ambient conditions, said method comprising at least the steps of:
carrying the substrate into and out of a process chamber by using a buffer chamber which is shared by said process chambers; and
implementing a process for the substrate in said process chamber.

26. A semiconductor device fabrication method including the conveyance of a substrate from a transfer chamber to process chambers, which abut on each other and have different ambient conditions, said method comprising the sequential steps of:

forming, in said transfer chamber, a buffer space which faces the opening of a process chamber and encloses the substrate and a substrate carriage means airtightly against the ambient condition in said transfer chamber;

evacuating and gas-feeding said buffer space thereby to set up an ambient condition which is equal to or different from the ambient condition in said process chamber which said buffer space faces;

processing the substrate;

carrying the substrate into said process chamber by opening a shutoff means of said process chamber;

drawing said carriage means back to said buffer space and closing said process chamber;

evacuating and gas-feeding said buffer space thereby to set up an ambient condition which is equal to or different from the ambient condition in said transfer chamber; and repeating the step of forming, in said transfer chamber, a buffer space which faces the opening of other process chamber and encloses the substrate and said substrate carriage means airtightly against the ambient condition in said transfer chamber, thereby carrying the substrate from one process chamber to another sequentially, while retaining the ambient conditions in said process chambers and said transfer chamber independently.

27. A semiconductor device fabrication method according to claim 26 further including at least the steps of:

cleaning the buffer chamber, which can carry a substrate by enclosing the substrate into and out of said process chamber, by feeding inert gas to said buffer chamber; and implementing a prescribed process for the substrate in said process chamber.

28. A semiconductor device fabrication method according to claim 26 including at least the step of setting up the buffer chamber to have a same ambient condition as of said process chamber, thereby preventing molecules and atoms from coming off the substrate surface, and carrying the substrate from one process chamber to another.

29. A semiconductor device fabrication method according to claim 26 including at least the step of evacuating the buffer chamber to a super-high vacuum state, and conducting a cross-contamination removal operation, which causes adhering gas to come off the substrate, in said buffer chamber during the conveyance of the substrate.

30. A semiconductor device fabrication method according to claim 26 including the step of feeding neutralization gas to the buffer chamber, thereby inactivating unwanted gas component on the substrate, and conducting a cross-contamination removal operation in said buffer chamber during the conveyance of the substrate.

31. A semiconductor device fabrication method according to claim 26 including the step of equalizing the ambient temperature in said process chamber to the ambient temperature of the buffer chamber, and carrying the substrate into said process chamber while controlling the substrate surface.

32. A semiconductor device fabrication apparatus having one or more process chambers and a transfer chamber, which abut on each other and have different ambient conditions, said apparatus further including at least buffer chamber means which can carry a substrate into and out of said process chambers, while retaining the ambient condition in said process chambers.

33. A semiconductor device fabrication apparatus having one or more process chambers and a transfer chamber, which abut on each other and have different ambient conditions, said apparatus further including at least:

means of equalizing the ambient condition in a movable buffer chamber, which encloses a substrate, to the ambient condition of a process chamber; and means of carrying the substrate into and out of said process chamber.

34. A semiconductor device fabrication apparatus having one or more process chambers and a transfer chamber, which abut on each other and have different ambient conditions, said apparatus further including at least:

buffer chamber means which is shared by said process chambers; and means of carrying the substrate into and out of a process chamber.

35. A semiconductor device fabrication apparatus having one or more process chambers and a transfer chamber, which abut on each other and have different ambient conditions, said apparatus further including at least:

substrate carriage means, and buffer means which is located in said transfer chamber and adapted to enclose said carriage means in a state of hold of a substrate;

drive means for positioning said buffer means to face the opening of an arbitrary process chamber, means of connecting said buffer means to the opening of said process chamber airtightly, and means of shutting the opening of said process chamber;

means of evacuating said buffer means, said transfer chamber and said process chambers independently, and means of feeding gases to said chambers independently; and means of controlling the driving of said buffer means, the substrate conveyance of said carriage means, the movement of said carriage means, the opening and closing of said airtight connection means, the opening and shutting of said shutting means, the evacuation of said evacuation means, and the feeding of said gas feed means.

36. A semiconductor device fabrication apparatus according to claim 35, wherein said process chambers include pattern forming means which implements a pattern drawing process based on charged particle rays.

37. A semiconductor device fabrication apparatus according to claim 35, wherein said process chambers include cleaning means which implements a cleaning process inside said chambers by being fed with gas.

38. A semiconductor device fabrication apparatus according to claim 35, wherein said process chambers include gas activation means which forms a pattern on the substrate surface based on the activation of gas.

39. A semiconductor device fabrication apparatus according to claim 35, wherein said process chambers include pattern growing means which implements a self growing process of an intended pattern.

40. A semiconductor device fabrication apparatus according to claim 35, wherein said process chambers include pattern removal means which implements a removal process of an intended pattern.

41. A semiconductor device fabrication apparatus according to claim 35, wherein said process chambers include pattern deposition means which implements a deposition process of an intended pattern.

42. A semiconductor device fabrication apparatus according to claim 35 including means of controlling the feed of active gas to the buffer chamber and the cleaning of said buffer chamber.

43. A semiconductor device fabrication apparatus according to claim 35 including shutoff means which separates the ambient condition in the movable buffer chamber, which can carry a substrate by enclosing the substrate into and out of said process chambers, from the ambient condition in said transfer chamber.

44. A semiconductor device fabrication apparatus according to claim 35 including:
   buffer chamber means having carriage means which has means of holding at least two pieces of substrates and can move along one axis; and
   process chambers each having a sample stage which can move in a direction perpendicular to said axis.

45. A semiconductor device fabrication apparatus according to claim 35 including:
   means of preventing extraneous substances created by the guide/support section from entering into the buffer chamber; and
   means of evacuating the guide/support space of gas.

46. A semiconductor device fabrication apparatus according to claim 35 including means of preventing ambient gas in the buffer chamber from entering into the guide/support section.

47. A semiconductor device fabrication apparatus according to claim 35 further including:
   means of measuring and inspecting a substrate during or after a process;
   means of sending measurement/inspection data to a central control system;
   means of logging the states of substrates and said process chambers; and
   means of implementing the self diagnosis of said process chambers and the whole apparatus.

48. A semiconductor device fabrication method by being carried between various process chambers and a transfer chamber, which abut on each other and have different ambient conditions, said semiconductor device being fabricated by a semiconductor device fabrication method in which a substrate is carried sequentially from one process chamber to another, with the ambient condition of each process chamber and the ambient condition of said transfer chamber being retained independently, so that functions are added to said semiconductor device based on repetitive processings in said process chambers.

49. A semiconductor device according to claim 48 fabricated by a semiconductor device fabrication method which includes two steps or more out of the steps of $SiO_2$ deposition, poly-Si deposition, $Si_3N_4$ deposition, poly-Si etching, $SiO_2$ etching, $Si_3N_4$ etching, $Ta_2O_5$ layer formation, and W layer formation, said steps being implemented for the substrate which is carried into and out of said process chambers by way of a movable buffer chamber.

50. A semiconductor device according to claim 48 fabricated by a semiconductor device fabrication method which includes at least a process of forming a silicon nitride thin film by implementing two steps or more out of the steps of $H_2$ process at a temperature of 950° C. and at an ambient pressure of 50 torr, thermal nitriding process at 900° C. and 10 torr, a $SiH_4/NH_3$ process at 850° C. and 1.5 torr, $SiH_4$ process at 720° C. and 5 torr, and $SiH_4$ process at 830° C. and 2 torr, said steps being implemented for the substrate which is carried into and out of said process chambers by way of a movable buffer chamber.

51. A semiconductor device fabricated by being carried between various process chambers and a transfer chamber, which abut on each other and have different ambient conditions, said semiconductor device being fabricated by a semiconductor device fabrication method in which a substrate is carried sequentially from one process chamber to another, with the ambient condition of each process chamber and the ambient condition of said transfer chamber being retained independently, so that functions are added to said semiconductor device based on repetitive processings in said process chambers.

52. A liquid crystal panel fabricated by a semiconductor device fabrication method in which a substrate is carried into and out of various process chambers and a transfer chamber, which abut on each other and have different ambient conditions, by way of a movable buffer chamber, said method including a process of forming a thin film transistor by implementing two steps or more out of the step of plasma cleaning and steps of forming films of silicon nitride, amorphous silicon, doped amorphous silicon, silicon dioxide, and oxide nitride.

53. An engineering material produced from two or more kinds of composite materials, such as metal and resin, said materials being processed by being carried into and out of various process chambers and a transfer chamber, which abut on each other and have different ambient conditions, by way of a movable buffer chamber so that material characteristics are added to said materials.

* * * * *